(12) United States Patent
Azuma et al.

(10) Patent No.: US 6,858,115 B2
(45) Date of Patent: Feb. 22, 2005

(54) PROCESS FOR REFORMING SURFACE OF SUBSTRATE, REFORMED SUBSTRATE AND APPARATUS FOR THE SAME

(75) Inventors: Hirozumi Azuma, Seto (JP); Akihiro Takeuchi, Seto (JP); Takaaki Matsuoka, Aichi-ken (JP); Kazuyuki Tachi, Nagoya (JP); Nobuo Kamiya, Nisshin (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 67 days.

(21) Appl. No.: 10/387,466

(22) Filed: Mar. 14, 2003

(65) Prior Publication Data

US 2003/0196891 A1 Oct. 23, 2003

(30) Foreign Application Priority Data

Mar. 15, 2002 (JP) ....................................... 2002-073011
Apr. 9, 2002 (JP) ....................................... 2002-106236
Jan. 8, 2003 (JP) ....................................... 2003-002331

(51) Int. Cl.$^7$ .............................................. C23C 14/34
(52) U.S. Cl. ............................. 204/192.11; 204/298.04; 204/298.11; 204/298.26
(58) Field of Search ....................... 204/192.11, 298.04, 204/298.11, 298.26

(56) References Cited

U.S. PATENT DOCUMENTS 5,104,480 A    4/1992   Wojnarowski et al. ...... 156/643
5,395,735 A  * 3/1995   Nagata et al. ......... 430/270.13
6,162,495 A  * 12/2000  Morton ....................... 427/166
6,284,441 B1    9/2001  Burberry .................... 430/346

FOREIGN PATENT DOCUMENTS

JP    2001-303255    10/2001
JP    2001-316485    11/2001

OTHER PUBLICATIONS

H. Tokunaga, et al., "Dependence of Cu Nucleus Density on PET Surface with Single Shot Irradiation of ArF Excimer Laser", (1 page) (with English translation of Related Portion) Extended Abstracts, The 63$^{rd}$ Autum Meeting: The Japan Society of Applied Physics, 2002.

* cited by examiner

Primary Examiner—Steven Versteeg
(74) Attorney, Agent, or Firm—Oblon, Spivak, McClelland, Maier & Neustadt, P.C.

(57) ABSTRACT

Sputtering particles are deposited immediately after activating a surface of a substrate composed of a carbon-containing material. Accordingly, a process for reforming a surface of a substrate, a substrate with a reformed surface, and an apparatus therefor are provided in which the depositability and adhesiveness of the sputtering particles are improved. A vacuum ultraviolet light is generated by a laser beam. A surface of a substrate composed of a carbon-containing material is exposed to the generated vacuum ultraviolet light. As a result, the surface of the substrate is activated. Simultaneously therewith, a sputtering particles-generating device generates sputtering particles, such as neutral atoms, ions and clusters. The resultant sputtering particles are deposited on the activated surface of the substrate. Since the sputtering particles are deposited immediately after the surface of the substrate is activated, they are adhered firmly on the surface of the substrate.

20 Claims, 18 Drawing Sheets

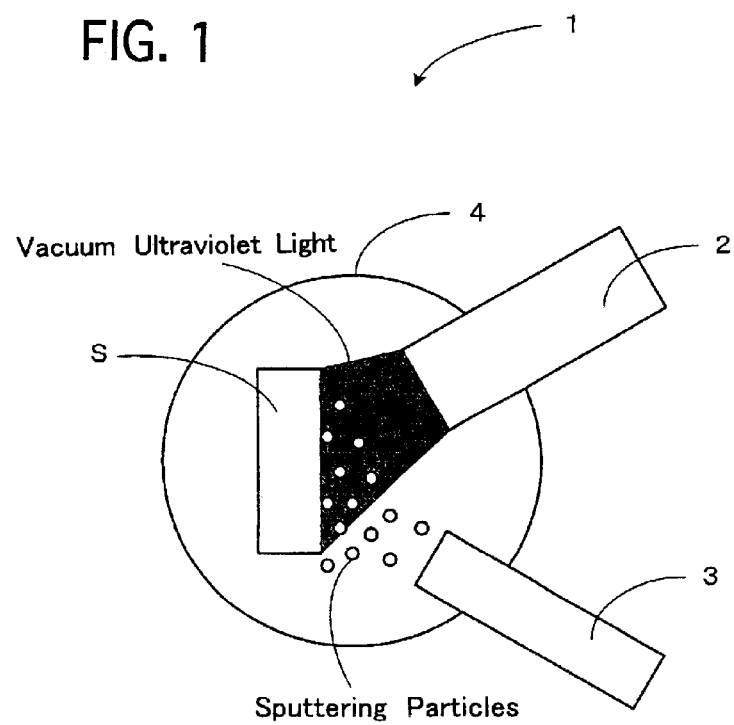

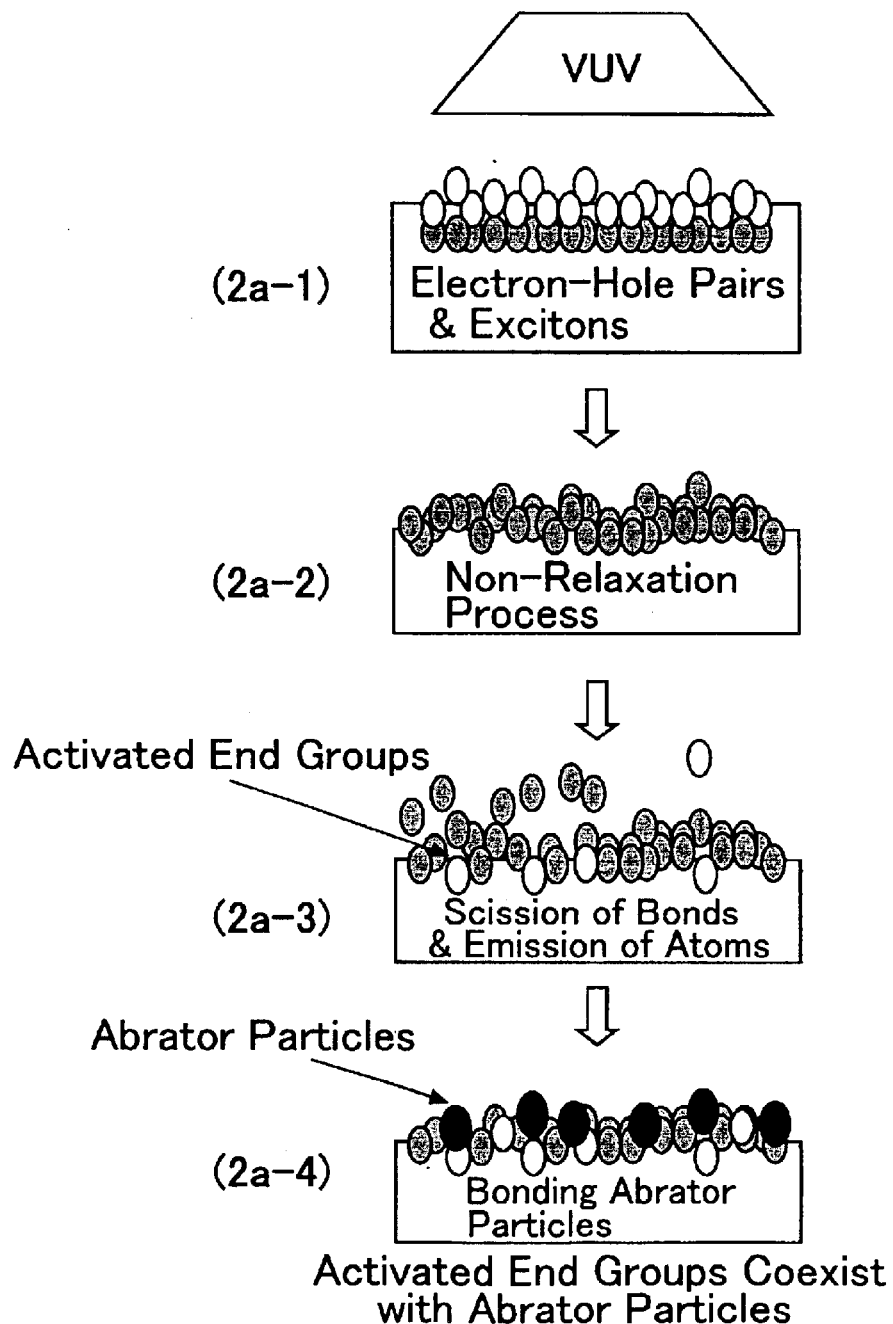

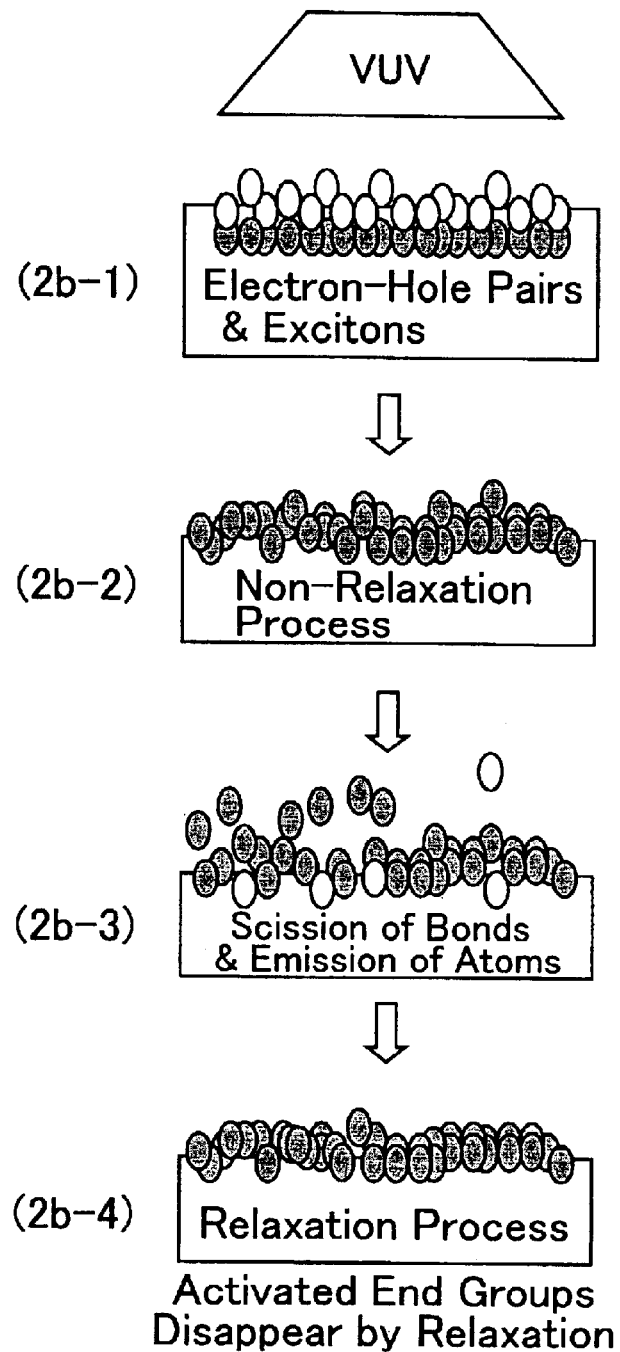

Adhesion of Sputtering Particles (2c-1) Relaxation Process (2c-2) Particles Adsorb Physically Particles Adsorb Physically on Surface 15 μm

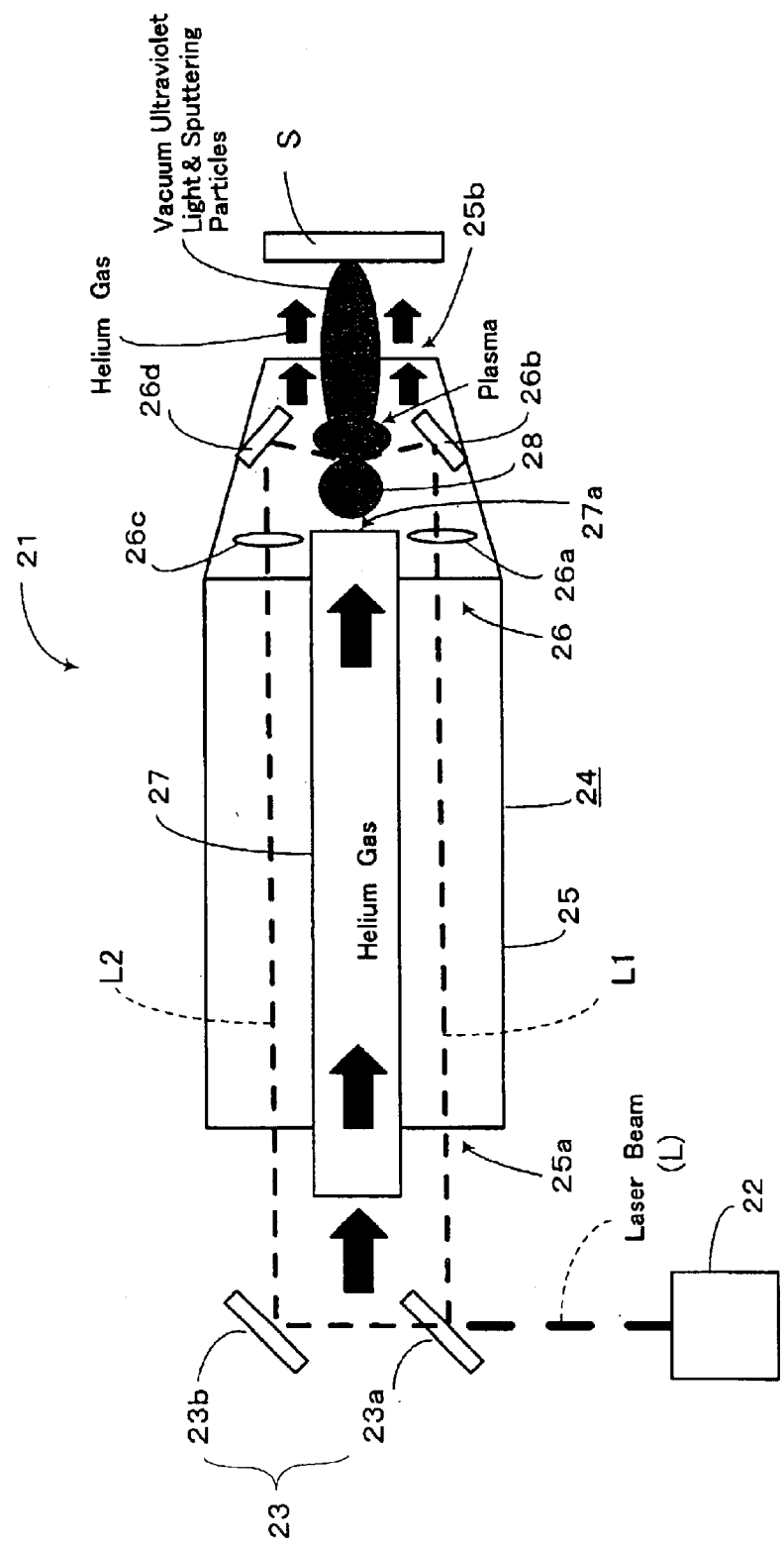

PROCESS FOR REFORMING SURFACE OF SUBSTRATE, REFORMED SUBSTRATE AND APPARATUS FOR THE SAME

BACKGROUND OF THE INVENTION

1. Field of the Invention

The present invention relates to a process for reforming a surface of a substrate composed of a carbon-containing material such as a resinous substrate, process which gives the surface a variety of characteristics such as physical and chemical characteristics. Moreover, it relates to a reformed substrate and an apparatus for the same.

2. Description of the Related Art

Conventionally, as techniques for reforming a surface of resinous substrates, the following processes are proposed. For example, resinous substrates are exposed to X-rays or ultraviolet lights, which result from synchronized orbital radiation. Alternatively, resinous substrates are exposed to ultraviolet lights to activate the surface by using ultraviolet lamps (see Japanese Unexamined Patent Publication (KOKAI) No. 2001-316,485). After the resinous substrates are exposed to X-rays or ultraviolet lights, they are subjected to additional treatments in air or in gas atmospheres depending on their applications.

However, in the above-described conventional technologies, since the surface of the resinous substrates, which are activated by being exposed to emitted lights, is varied with time, or since it is exposed to gas atmospheres, it has been deactivated. Thereafter, the resinous substrates are subjected to additional treatments depending on the applications. Accordingly, there is a problem in that the advantages resulting from the exposure to X-rays might be diminished. Moreover, facilities for generating synchronized orbital radiation are large-sized facilities, and are mostly used in a time-sharing manner. Consequently, there arises a problem in that it is difficult to develop materials by using many samples by trial and error. On the other hand, in the exposure to ultraviolet lamps for mainly generating ultraviolet lights whose wavelength is 200 nm or more, the ultraviolet lights are absorbed by resinous surfaces with an absorptivity decreased by a factor of $1/100$ or less, compared with a vacuum ultraviolet light whose wavelength falls in a range of from 50 nm to 100 nm. As a result, there is a problem in that the advantage resulting from the activation is effected extremely less.

The present invention has been developed in view of the above-described circumstances. It is therefore an object of the present invention to provide a process for reforming a surface of substrate by which the various characteristics of the surface are improved such as the depositability, adhesiveness, scratch resistance, dent resistance, ozone resistance, yellowing preventiveness, grooming resistance, dirt resistance, water repellency, hydrophilicity, mildewproofness, frictional property, stainability, printability, writability and lubricative property. And also, improving the electrical conductivity of the substrate by the present invention enables us to spray electrostatically. Moreover, it is a further object of the present invention to provide a reformed substrate provided with the upgraded characteristics, and an apparatus for the same.

SUMMARY OF THE INVENTION

In a first aspect of the present invention, a process according to the present invention is adapted for reforming a surface of a substrate composed of a carbon-containing material, and comprises the step of: exposing a surface of a substrate to a vacuum ultraviolet light, and depositing sputtering particles on the surface of the substrate.

When the surface of the substrate composed of a carbon-material is exposed to the vacuum ultraviolet light which is absorbed greatly by carbon-containing materials, the p-shell electrons, the outer shell electrons in carbon atoms, are excited or ionized at the substrate surface so that the molecular bonds are destroyed to activate the substrate surface composed of a carbon-containing material. At the same time, the sputtering particles are adhered on the substrate surface which is activated by the exposure to the vacuum ultraviolet light so that they are adhered firmly on the substrate surface. Therefore, it is possible to give a surface of substrates, such as resinous substrates composed of carbon-containing materials, the mechanical, physical and chemical characteristics such as the dent resistance, wettability, water repellency, damage resistance, lipophilicity, gas-barrier property, depositability, adhesiveness, scratch resistance, ozone resistance, yellowing preventiveness, grooming resistance, dirt resistance, hydrophilicity, mildewproofness, frictional property, stainability, printability, writability, electrical conductivity and lubricative property. Simultaneously, it is possible to improve the adhesiveness of films such as paintings and platings.

In a second aspect of the present invention, the substrate is placed on a side of a laser beam-irradiating surface of a target material, the surface of the substrate is exposed to a vacuum ultraviolet light which is generated by irradiating the target material with a laser beam, and particles, which sputter from the target material, are deposited on the surface of the substrate.

When the target material is irradiated with the laser beam, a high-temperature plasma is formed on a surface of the target material, and the vacuum ultraviolet light is thereby generated from the plasma. The resultant vacuum ultraviolet light is adsorbed by carbon-containing materials with a high absorptivity. When the surface of the substrate is exposed to the vacuum ultraviolet light, the p-shell electrons, the outer shell electrons in carbon atoms, are excited or ionized at the substrate surface so that the molecular bonds are destroyed to activate the substrate surface composed of a carbon-containing material. On the other hand, at the surface of the target material, which is heated within the plasma or by the plasma, particles such as neutral atoms, ions and clusters are formed, and sputter from the inside of the plasma or from the surface of the target material at velocities as high as the sonic-velocity level. Accordingly, the surface of the substrate is activated by the exposure to the vacuum ultraviolet light, and is covered with the sputtering particles immediately thereafter. Consequently, the particles are adhered firmly on the surface of the substrate.

As for the target material, depending on the applications of the substrate with the thus reformed surface, it is possible to use metals, such as Cu, Al, Ti, Cr, Pt, Au, Ag, Zr, Mg, Ni, Fe, Co, Zn, Sn, W and Be, semiconductors, ceramics, carbon and composite materials of these.

In a third aspect of the present invention, the substrate is placed on a side of a laser beam-irradiating surface of a target material in a container, and the target material placed in the container is irradiated with a laser beam. Note that the container can desirably be vacuum containers.

Since the vacuum ultraviolet light which is generated from the plasma is hardly absorbed by air in the vacuum container, it is possible to satisfactorily activate a surface of substrates composed of carbon-containing materials. Moreover, since the sputtering particles, which sputter from the inside of the plasma or from the surface of the target material at velocities as high as the sonic-velocity level, are not blocked or decelerated by atmospheric molecules, which are present between the substrate and the target material, it is possible to securely deposit the sputtering particles on the substrate surface which is activated by the exposure to the vacuum ultraviolet light.

In a fourth aspect of the present invention, the target material is irradiated with a laser beam in a shielding gas atmosphere or while supplying a shielding gas between the substrate and the target material at least.

A vacuum ultraviolet light is generated in a plasma in a shielding gas atmosphere. When the shielding gas is supplied, the vacuum ultraviolet light is inhibited from being absorbed by air. Accordingly, it is possible to favorably activate the substrate surface.

In a fifth aspect of the present invention, the target material is irradiated with a laser beam in a shielding gas atmosphere or while supplying a shielding gas between the substrate and the target material at least.

When a hydrogen gas, and the like, which absorb the vacuum ultraviolet light remarkably less, are used as the shielding gas, it is possible to securely pass and generate the vacuum ultraviolet light, for example, a vacuum ultraviolet light whose wavelength falls in a range of from 50 to 100 nm, in air, and to reliably expose the substrate surface to the vacuum ultraviolet light.

In a sixth aspect of the present invention, the substrate is composed of a transparent substrate in which a laser beam can transmit, and the target material is irradiated with a laser beam through the transparent substrate.

When the target material is irradiated with the laser beam through the transparent substrate, it is possible to use lenses whose focal length is short in order to focus the laser beam on the target material. Accordingly, it is possible to carry out the irradiation with a large F value. Consequently, it is possible to reform a surface of transparent substrates such as transparent resinous films in an atmosphere close to air. Moreover, since the transparent substrate with the thus reformed surface is good in terms of the characteristics such as the heat-ray reflection or absorption property, the gas-barrier property and the electromagnetic-shielding property, it is possible to actually carry out coating such as heat-ray protective films, electromagnetic-shielding films and gas-barrier layers with the present surface reforming process.

In a seventh aspect of the present invention, the laser beam is a pulse laser beam whose pulse duration falls in a range of from 100 picoseconds to 100 nanoseconds.

With the arrangement, it is possible to inhibit the transparent substrate from being damaged or denatured even when the laser beam transmits through the transparent substrate. The pulse duration can further preferably fall in a range of from 100 picoseconds to 20 nanoseconds, furthermore preferably from 1 nanoseconds to 10 nanoseconds.

In an eighth aspect of the present invention, the conditions of irradiating the target material with the laser beam are set so as to generate a vacuum ultraviolet light, whose wavelength falls in a range of from 50 to 100 nm, from the target material.

Since the vacuum ultraviolet light whose wavelength falls in a range of from 50 to 100 nm is absorbed by carbon-containing materials with a high absorptivity, the molecular bonds in carbon-containing materials are destroyed effectively so that the substrate surface is activated securely. The wavelength can further preferably fall in a range of from 50 to 80 nm.

In a ninth aspect of the present invention, the irradiation intensity of the laser beam is set so as to fall in a range of from $10^6$ to $10^{12}$ W/cm$^2$.

When the irradiation intensity of the laser beam is set within the aforementioned range, it is possible to securely generate the vacuum ultraviolet light whose wavelength falls in a range of from 50 to 100 nm which is absorbed by carbon-containing materials with a high absorptivity. When the substrate surface is exposed to the ultraviolet light, the molecular bonds in carbon-containing materials are destroyed effectively so that the substrate surface is activated securely. The irradiation intensity can further preferably fall in a range of from $10^9$ to $10^{11}$ W/cm$^2$, furthermore preferably from $4 \times 10^9$ to $8 \times 10^{10}$ W/cm$^2$.

In a tenth aspect of the present invention, a substrate is provided with a reformed superficial portion, and comprises: a substrate composed of a carbon-containing material; a surface exposed to a vacuum ultraviolet light; and particles deposited on a part of the surface at least.

In the present reformed substrate, the particles are deposited on the surface of the substrate composed of a carbon-containing material which is activated by the exposure to the vacuum ultraviolet light. Accordingly, the deposited particles are firmly adhered on the surface of the substrate. Consequently, the surface of the substrate is provided with the mechanical, physical and chemical characteristics such as the dent resistance, wettability, water repellency, damage resistance, lipophilicity, gas-barrier property, depositability, adhesiveness, scratch resistance, ozone resistance, yellowing preventiveness, grooming resistance, dirt resistance, hydrophilicity, mildewproofness, frictional property, stainability, printability, writability, electrical conductivity and lubricative property. Simultaneously, the surface of the substrate is good in terms of the adhesiveness of films such as paintings and platings.

In an eleventh aspect of the present invention, an apparatus is adapted for reforming a surface of a substrate composed of a carbon-containing material, and comprises: means for exposing the surface of the substrate to a vacuum ultraviolet light; and means for generating sputtering particles which are to be deposited on the surface of the substrate exposed to the vacuum ultraviolet light.

The surface of the substrate composed of a carbon-containing material is exposed to the vacuum ultraviolet light, which carbon-containing materials absorb with a high absorptivity, by the exposing means. The sputtering particles are generated by the generating means, and are simultaneously adhered firmly on the substrate surface which is activated by the exposure to the vacuum ultraviolet light.

In a twelfth aspect of the present invention, the exposure of the substrate to the vacuum ultraviolet light by the exposing means and the generation of the sputtering particles by the generating means are carried out simultaneously.

When the exposure of the substrate to the vacuum ultraviolet light and the generation of the sputtering particles are carried out simultaneously, the sputtering particles are deposited immediately after the substrate surface is activated by the exposure to the vacuum ultraviolet light. Accordingly, it is possible to firmly adhere the particles on the substrate surface securely.

In a thirteenth aspect of the present invention, an apparatus is adapted for reforming a surface of a substrate composed of a carbon-containing material, and comprises: a laser beam-generating device for generating a laser beam; a target material; a substrate placed on a side of a laser beam-irradiating surface of the target material, and composed of a carbon-containing material; and optics for focusing the laser beam generated by the laser beam-generating device on the target material, wherein the surface of the substrate is exposed to a vacuum ultraviolet light, which is generated by irradiating the target material with the laser beam through the optics, and particles, which sputter from a surface of the target material irradiated with the laser beam, are deposited on the surface of the substrate.

In a fourteenth aspect of the present invention, the apparatus further comprises a container in which the substrate is placed on the side of the laser beam-irradiating surface of the target material, wherein the laser beam generated by the laser beam-generating device is led into the container through the optics, and is focused on the target material. Note that the container can desirably be vacuum containers.

In a fifteenth aspect of the present invention, the apparatus further comprises means for supplying a shielding gas, wherein the target material is irradiated with the laser beam through the optics while supplying the shielding gas between the substrate and the target material at least with the supplying means.

When a helium gas, and the like, which absorb vacuum ultraviolet lights less, is used as the shielding gas and the substrate is exposed to the vacuum ultraviolet light in such a shielding gas atmosphere, it is not necessary to place substrates to be subjected to the processing in any vacuum container. Accordingly, not limited to methods in which substrates are batch processed by a unit of predetermined pieces, it is possible to continuously carry out surface reforming treatments, or to carry out surface reforming treatments onto large-sized component parts, with the present surface reforming apparatus.

In a sixteenth aspect of the present invention, the apparatus further comprises a processing chamber in which a shielding gas atmosphere is kept and the substrate is placed on the side of the laser beam-irradiating surface of the target material, wherein the surface of the substrate is exposed to a vacuum ultraviolet light, which is generated by irradiating the target material with the laser beam through the optics, and particles, which sputter from a surface of the target material irradiated with the laser beam, are deposited on the surface of the substrate within the processing chamber.

In the processing chamber in which the shielding gas atmosphere is kept, the shielding gas atmosphere inhibits the air from absorbing the vacuum ultraviolet light. Accordingly, it is possible to satisfactorily activate the substrate surface.

In a seventeenth aspect of the present invention, the apparatus further comprises a preparatory chamber disposed between an external space and the processing chamber to communicate with the processing chamber, wherein the substrate is brought in into the processing chamber from the external space through the preparatory chamber, and is taken out from the processing chamber to the external space through the preparatory chamber.

Since the substrate is brought in into the processing chamber and is taken out from the processing chamber through the preparatory chamber, it is possible to securely keep the shielding gas atmosphere within the processing chamber. Moreover, since the substrate is brought in into the processing chamber from the external space through the preparatory chamber, the brought-in substrate is subjected to a surface reforming treatment, and the processed substrate is taken out from the processing chamber to the external space through the preparatory chamber, it is possible to achieve production systems which can carry out surface reforming treatments onto a large volume of substrates continuously and efficiently.

In an eighteenth aspect of the present invention, a gas whose specific gravity is smaller than that of air is used as the shielding gas, and the processing chamber is disposed at an upper position with respect to the preparatory chamber.

With the arrangement, it is possible to localize the shielding gas within the processing chamber. Accordingly, it is possible to securely keep the shielding gas atmosphere within the processing chamber.

In a nineteenth aspect of the present invention, a gas whose specific gravity is larger than that of air is used as the shielding gas, and the processing chamber is disposed at a lower position with respect to the preparatory chamber.

With the arrangement, it is possible to localize the shielding gas within the processing chamber. Accordingly, it is possible to securely keep the shielding gas atmosphere within the processing chamber.

In a twentieth aspect of the present invention, the apparatus further comprises an openable-and-closable partition wall disposed between the processing chamber and the preparatory chamber and/or between the external space and the preparatory chamber, wherein the partition wall is opened or closed to communicate the processing chamber with or separate it from the preparatory chamber and/or to communicate the external space with or separate it from the preparatory chamber.

With the arrangement, even when the shielding gas is likely to mix with air due to the reasons that the specific gravity of the shielding gas is close to that of air, and the like, it is possible to securely keep the shielding gas atmosphere within the processing chamber.

In a twenty-first aspect of the present invention, the shielding gas is at least one member selected from the group consisting of a hydrogen gas, a helium gas, a neon gas, an argon gas and mixture gases composed of arbitrary combination of the gases.

In a twenty-second aspect of the present invention, the substrate is composed of a transparent substrate in which a laser beam can transmit, and the laser beam-generating device irradiates the target material with a laser beam through the transparent substrate.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure:

FIG. 1 is a schematic construction diagram for illustrating an overall construction of a substrate surface reforming apparatus in a First Preferred Embodiment according to the present invention;

FIG. 2a-c are diagrams for schematically illustrating a structure of a resinous-substrate surface, wherein:

FIG. 2a shows when the resinous-substrate surface was subjected the exposure to a vacuum ultraviolet light and the deposition of sputtering particles;

FIG. 2b shows when the resinous-substrate surface was subjected the exposure to a vacuum ultraviolet light alone; and FIG. 2c shows when the resinous-substrate surface was subjected the deposition of sputtering particles alone;

FIG. 8a-b concern Example No. 2, and are traced images in which a film, formed on a silicone-rubber substrate and composed of copper particles, was viewed, wherein:

FIG. 8a is a traced image viewed before assessing the adhesiveness; and

FIG. 8b is a traced image viewed after assessing the adhesiveness;

FIG. 10a-b concern Example No. 2, and are traced images in which a film, formed on a polytetrafluoroethylene resinous substrate and composed of copper particles, was viewed, wherein:

FIG. 10a is a traced image viewed before assessing the adhesiveness; and

FIG. 10b is a traced image viewed after assessing the adhesiveness;

FIG. 11 is a schematic construction diagram for illustrating an overall construction of a substrate surface reforming apparatus in a Third Preferred Embodiment according to the present invention;

DETAILED DESCRIPTION OF THE PREFERRED EMBODIMENTS

Figure 2C:
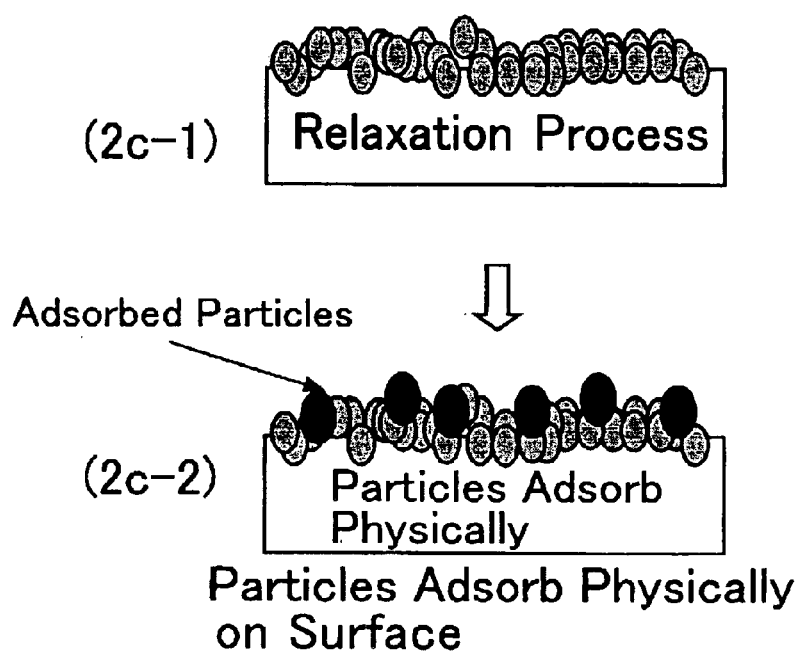

Having generally described the present invention, a further understanding can be obtained by reference to the specific preferred embodiments which are provided herein for the purpose of illustration only and not intended to limit the scope of the appended claims.

Hereinafter, preferred embodiments according to the present invention will be described in detail. The respective preferred embodiments embody a process for reforming a surface of a substrate, a reformed substrate and an apparatus for the same according to the present invention.

First Preferred Embodiment

First of all, a substrate surface reforming apparatus 1 in a First Preferred Embodiment according to the present invention will be described with reference to FIG. 1.

FIG. 1 is a schematic construction diagram for illustrating an overall construction of the substrate surface reforming apparatus 1. The substrate surface reforming apparatus 1 comprises a vacuum ultraviolet light-generating device 2, an electron beam deposition device 3, and a container 4 in which a resinous substrate S is placed. The resinous substrate S is to be subjected to a surface reforming treatment. Note that the vacuum ultraviolet light-generating device 2 makes the exposing means according to the present invention, and the electron beam deposition device 3 makes the generating means, respectively.

The resinous substrate S can be substrates composed of a variety of resinous materials, such polytetrafluoroethylene, silicone rubber, epoxy resin, polypropylene, polyethylene and polyethylene terephthalate. However, the object of the surface reforming is not limited to resinous substrates. It is possible to subject substrates composed of carbon-containing material shaving carbon-carbon bonds, preferably organic materials, further preferably resinous materials, to the surface reforming. Note that the resinous substrate S corresponds to the substrate composed of a carbon-containing material according to the present invention.

The vacuum ultraviolet light-generating device 2 is a lamp which can emit a vacuum ultraviolet light (or referred to as vacuum ultraviolet radiation whenever appropriate) whose wavelength falls in a range of from 50 to 100 nm. It is placed so that the resinous substrate S, which is placed within the vacuumed container 4, is exposed to the vacuum ultraviolet light. Note that the ultraviolet lights whose wavelength is 200 nm or less are referred to as the vacuum ultraviolet light in the present invention.

The electron beam deposition device 3 can sputter particles, which are composed of metals, such as Cu, Al, Ti, Cr, Pt, Au, Ag, Zr, Mg, Ni, Fe, Co, Zn, Sn, W and Be, semiconductors, ceramics, carbon and composite materials of these, depending on the applications of the resinous substrate S.

Hereinafter, the operations -and advantages, which are effected when the surface reforming treatment of the resinous substrate S is carried out with the substrate surface reforming apparatus 1, will be described with reference to FIG. 2a.

When the vacuum ultraviolet light-generating device 2 generates the vacuum ultraviolet light whose wavelength falls in a range of from 50 to 100 nm, the resinous substrate S, which is placed within the vacuumed container 4, is exposed to the vacuum ultraviolet light. Then, on a surface of the resinous substrate S, the separation occurs between the electron-hole pairs and the excitons (see (2a-1) in FIG. 2a). The surface goes through the non-relaxation process in which the p electrons, being the outer shell electrons in the carbon atoms, are excited or ionized (see (2a-2) in FIG. 2a). Finally, the bonds between the main chains and side chains of the resinous structure are broken, and thereby the electrons, which have been involved in the bonds, are emitted to form activated end groups (seen (2a-3) in FIG. 2a).

Subsequently, when the sputtering particles, such as neutral atoms, ions and clusters, which are generated by the electron beam deposition device 3, are deposited on the surface of the resinous substrate S, which is activated by the exposure to the vacuum ultraviolet light, the activated end groups are fixed to produce a state in which the activated end groups and the sputtering particles (or abrator particles) coexist. Thus, the electrons are inhibited from being supplied to the surface or being excited inversely so that the activated resinous surface is sustained for a long period of time (see (2a-4) in FIG. 2).

Hence, the resinous substrate S, having the reformed surface which is produced by the above-described process according to the First Preferred Embodiment, is provided with the mechanical, physical and chemical characteristics such as the dent resistance, wettability, water repellency, damage resistance, lipophilicity, gas-barrier property, depositability, adhesiveness, scratch resistance, ozone resistance, yellowing preventiveness, grooming resistance, dirt resistance, hydrophilicity, mildewproofness, frictional property, stainability, printability, writability and lubricative property. Simultaneously, it effects an advantage in that it is good in terms of the adhesiveness of films such as paintings and platings.

For comparison, other superficial structures of the resinous substrate S will be hereinafter described with reference to FIGS. 2b and 2c. In the case of FIG. 2b, the resinous substrate S is exposed to the vacuum ultraviolet light only. In the case of FIG. 2c, it is subjected to the deposition of the sputtering particles alone.

When the resinous substrate S is exposed to the vacuum ultraviolet light only, on a surface of the resinous substrate S, the separation occurs between the electron-hole pairs and the excitons (see (2b-1) in FIG. 2b). The surface goes through the non-relaxation process in which the p electrons, being the outer shell electrons in the carbon atoms, are excited or ionized (see (2b-2) in FIG. 2b). Finally, the bonds between the main chains and side chains of the resinous structure are broken, and thereby the electrons, which have been involved in the bonds, are emitted to form activated end groups once (seen (2b-3) in FIG. 2b). However, when the surface is left as it is, the p electrons are put back to the original state (i.e., the relaxation process), because the electrons are supplied from the inside or outside, or because they are excited inversely. Thus, the activated end groups disappear from the surface of the resinous substrate S. Eventually, the surface of the resinous substrate S returns back to the deactivated state (see (2b-4) in FIG. 2b).

On the other hand, when the resinous substrate S is subjected to the deposition of the sputtering particles alone, only the physical deposition of the sputtering particles occurs on the surface of the resinous substrate S (see (2c-2) in FIG. 2c) in the relaxation sate free from the activated end groups (see (2c-1) in FIG. 2c). Thus, no activated resinous surface is formed at all.

As described above, it is seen that the activate surface can be sustained only when the substrate, such as resinous substrates composed of carbon-containing materials, is subjected to both the exposure to the vacuum ultraviolet light and the deposition of the sputtering particles.

Second Preferred Embodiment

Hereinafter, a substrate surface reforming apparatus 11 in a Second Preferred Embodiment according to the present invention will be described with reference to FIG. 4.

Figure 4:
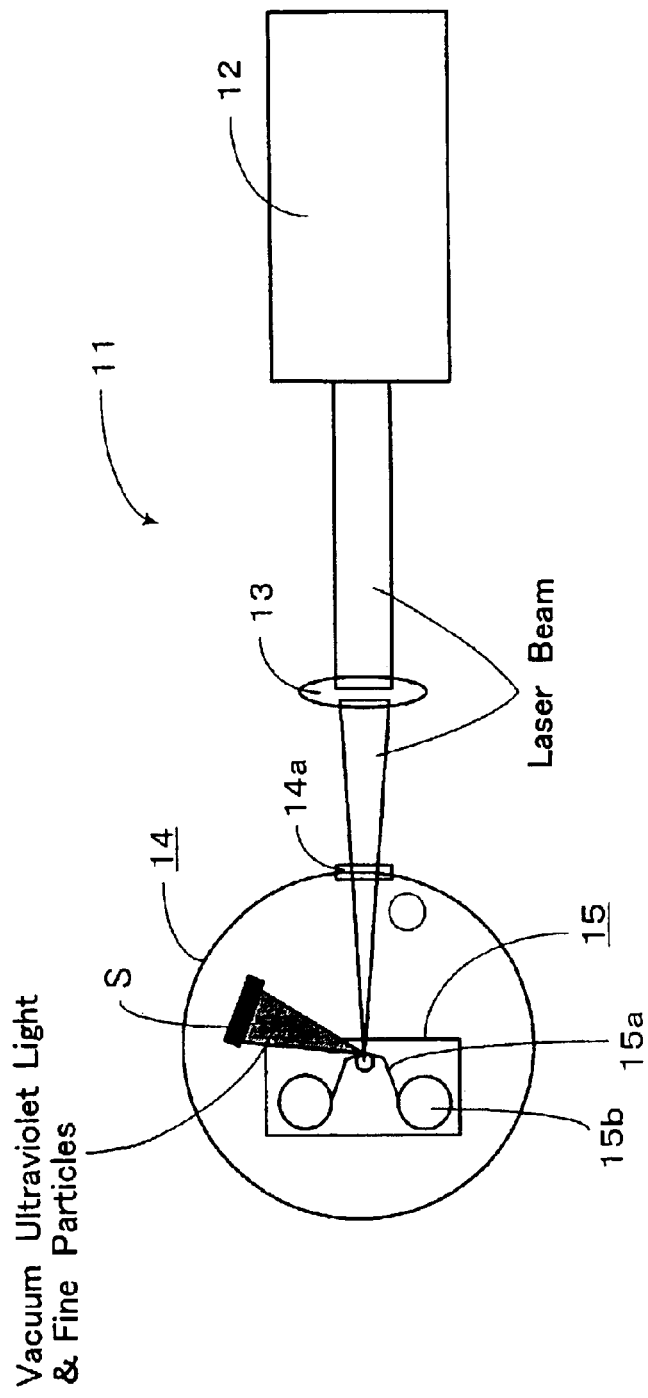
FIG. 4 is a schematic construction diagram for illustrating an overall construction of a substrate surface reforming apparatus in a Second Preferred Embodiment according to the present invention.

FIG. 4 is a schematic construction diagram for illustrating an overall construction of the substrate surface reforming apparatus 11. The substrate surface reforming apparatus 11 comprises a YAG laser device 12, a condenser 13, a vacuum container 14 in which a resinous substrate S is placed as the substrate, and a target driving system 15 which holds a target material 15a. The resinous substrate S is to be subjected to a surface reforming treatment, and is composed of a carbon-containing material. Note that the YAG laser device 12 makes the laser beam-generating device according to the present invention, the condenser 13 makes the optical member, and the YAG laser device 12 and target driving system 15 make the exposing means and generating means, respectively.

Since the resinous substrate S is the same as the resinous substrate in the above-described First Preferred Embodiment, it will not be described herein in detail. Moreover, note that, as described in the First Preferred Embodiment, the objects to be processed are not limited to resinous substrates, and that they can be substrates which comprise carbon-containing materials.

The YAG laser device 12 is a known laser beam-generating device. It is disposed so as to emit a laser beam toward the target material 15a placed in the vacuum container 14.

The condenser 13 is disposed between the YAG laser device 12 and the vacuum container 14. It is an optical member which leads the laser beam generated from the YAG laser device 12 into the vacuum container 14 through a glass window 14a of the vacuum container 14 and focuses the laser beam on the target material 15a. In the condenser 13, the size or refractive index of the lens is designed so that the laser beam is focused with a predetermined irradiation intensity on the target material 15a. Moreover, the irradiation intensity can preferably be controlled so that the plasma generated from the target material 15a generates a vacuum ultraviolet light having a wavelength which is absorbed by resinous substrates with a high absorptivity. Specifically, the irradiation intensity of the laser beam can preferably fall in a range of from $10^6$ to $10^{12}$ W/cm$^2$.

The vacuum container 14 is a container in which vacuum is kept. It accommodates the resinous substrate S, an object to be processed, and the target driving system 15 therein. In the vacuum container 14, the resinous substrate S is placed on a side of a laser beam-irradiating surface of the target material 15a which is held by the target driving system 15. Moreover, the vacuum container 14 is provided with the window 14a. The window 14a enables the laser beam generated from the YAG laser device 12 to enter into the vacuum container 14, and is composed of a transparent material such as glass.

The target driving system 15 comprises the continuous strip-shaped target material 15a, and a pair rollers 15b which feed the target material 15a to a laser beam-irradiating position and wind the target material 15a to accommodate after the target material 15a is irradiated with the laser beam. As for the target material 15a, depending on the applications of the resinous substrate S, it is possible to use metals, such as Cu, Al, Ti, Cr, Pt, Au, Ag, Zr, Mg, Ni, Fe, Co, Zn, Sn, W and Be, semiconductors, ceramics, carbon and composite materials of these.

Hereinafter, the operations and advantages, which are effected when the surface reforming treatment of the resinous substrate S is carried out with the substrate surface reforming apparatus 11, will be described.

When the YAG laser device 12 generates the laser beam, the condenser 13 leads the laser beam into the vacuum container 14 through the window 14a and focuses it on the target material 15a. When the target material 15a is irradiated with the laser beam, a high-temperature plasma is formed on a surface of the target material 15a. The temperature of the plasma is controlled so that the vacuum ultraviolet light whose wavelength falls in a range of from 50 to 100 nm is generated. The vacuum ultraviolet light having the wavelength is absorbed by resinous materials with a high absorptivity. Accordingly, when the surface of the resinous substrate S is exposed to the vacuum ultraviolet light, the molecular bonds in the surface are destroyed by the vacuum ultraviolet light so that the resinous surface is activated.

On the other hand, on the surface of the target material 15a which is heated within the plasma or by the plasma, neutral atoms, ions and clusters are formed. They sputter from the surface of the target material 15a at velocities as high as the sonic-velocity level.

Accordingly, the surface of the resinous substrate S, which is placed adjacent to the plasma formed on the surface of the target material 15a, is activated by the exposure to the vacuum ultraviolet light, and immediately thereafter the sputtering particles adhere on the surface of the resinous substrate S. Consequently, the sputtering particles firmly adhere on the surface of the resinous substrate S. As a result, the electrons are inhibited from being supplied to the surface or being excited inversely so that the activated resinous surface is sustained for a long period of time. Note that the phenomena in the above process take place successively in the same manner as described in the First Preferred Embodiment.

Hence, the resinous substrate S, having the reformed surface which is produced by the above-described process according to the Second Preferred Embodiment, is provided with the mechanical, physical and chemical characteristics such as the dent resistance, wettability, water repellency, damage resistance, lipophilicity, gas-barrier property, depositability, adhesiveness, scratch resistance, ozone resistance, yellowing preventiveness, grooming resistance, dirt resistance, hydrophilicity, mildewproofness, frictional property, stainability, printability, writability and lubricative property. Simultaneously, it effects an advantage in that it is good in terms of the adhesiveness of films such as paintings and platings.

Moreover, in the Second Preferred Embodiment, the exposure of the resinous substrate S to the vacuum ultraviolet light and the generation of the sputtering particles are achieved simultaneously by emitting the laser beam onto the target material 15a. Thus, it is possible to remarkably simplify the entire construction of the apparatus.

Third Preferred Embodiment

Hereinafter, a substrate surface reforming apparatus 21 in a Third Preferred Embodiment according to the present invention will be described with reference to FIG. 11.

FIG. 11 is a schematic construction diagram for illustrating an overall construction of the substrate surface reforming apparatus 21. The substrate surface reforming apparatus 21 comprises a YAG laser device 22, a first optical member 23, an abrasion gun 24, and a target material 28. Note that the YAG laser device 22 makes the laser beam-generating device according to the present invention, and the YAG laser device 22 and target material 28 make the exposing means and generating means, respectively.

Since a resinous substrate S is the same as the resinous substrate in the above-described First Preferred Embodiment, it will not be described herein in detail. Moreover, note that, as described in the First Preferred Embodiment, the objects to be processed are not limited to resinous substrates, and that they can be substrates which comprise carbon-containing materials.

The YAG laser device 22 is a known laser beam-generating device. It is disposed so as to emit a laser beam (L) toward a half mirror 23a of the first optical member 23.

The first optical member 23 comprises the half mirror 23a and a reflector mirror 23b, and leads the laser beam, emitted by the YAG laser device 22, into the abrasion gun 24 while dividing the laser beam into two parts. Specifically, the YAG laser device 22 emits the laser beam (L) onto the half mirror 23a, and the laser beam (L) enters the half mirror 23a at an incident angle of about 45 degrees. Thus, the incident beam is reflected by half of the beam intensity at the half mirror 23a, and is led into the abrasion gun 24 (hereinafter referred to as a first path L1). On the other hand, the other half of the incident beam transmits through the half mirror 23a, and enters the reflector mirror 23b at an incident angle of about 45 degrees. Thus, the other half of the incident beam is reflected totally at the reflector mirror 23b, and is led into the abrasion gun 24 in parallel to the laser beam following the first path L1 (hereinafter referred to as a second path L2).

The abrasion gun 24 comprises a case 25, a second optical member 26, a gas nozzle 27 which sprays a helium gas, and a target material 28. Note that the first optical member 23 and second optical member 26 make the optical member according to the present invention, and the gas nozzle 27 makes the supplying means.

The case 25 is provided with an incident opening 25a and an emission opening 25b. The incident opening 25a is formed at the trailing end of the case 25, and lets the laser beam coming from the first optical member 23 enter into the case 25. The emission opening 25b is formed at the leading end of the case 25, and lets particles sputtering from the target material 28 discharge toward the resinous substrate S to be subjected to a surface reforming treatment. Moreover, the case 25 accommodates the second optical member 26, gas nozzle 27 and target material 28 therein.

The second optical member 26 comprises a first condenser 26a, a first reflector mirror 26b, a second condenser 26c, and a second reflector mirror 26d. The first condenser 26a focuses the laser beam following the first path L1. The first reflector mirror 26b reflects the laser beam which is focused by the first condenser 26a, and emits it onto a surface of the target material 28, surface which faces the emission opening 25b. The second condenser 26c focuses the laser beam following the second path L2. The second reflector mirror 26d reflects the laser beam which is focused by the second condenser 26c, and emits it onto the surface of the target material 28, surface which faces the emission opening 25b.

In the first and second condensers 26a, 26c, the size or refractive index of the lenses are designed so that the laser beam is focused with a predetermined irradiation intensity on the target material 28. Moreover, the irradiation intensity can preferably be controlled so that the plasma generated from the target material 28 generates a vacuum ultraviolet light having a wavelength which is absorbed by resinous substrates with a high absorptivity. Specifically, the irradiation intensity of the laser beam can preferably fall in a range of from $10^6$ to $10^{12}$ W/cm$^2$.

The gas nozzle 27 is a gas spraying nozzle for supplying a helium gas between the target material 28 and the resinous substrate S. The helium gas is a shielding gas for shielding the vacuum ultraviolet light and sputtering particles which are generated from the target material 28. The gas nozzle 27 is connected with a not-shown gas tank which stores the helium gas, and is placed on a rear side with respect to the target material 28 in the case 25 (i.e., on the left hand side in FIG. 11), and its spraying opening 27a is directed toward the emission opening 25b of the case 25.

Figure 12:
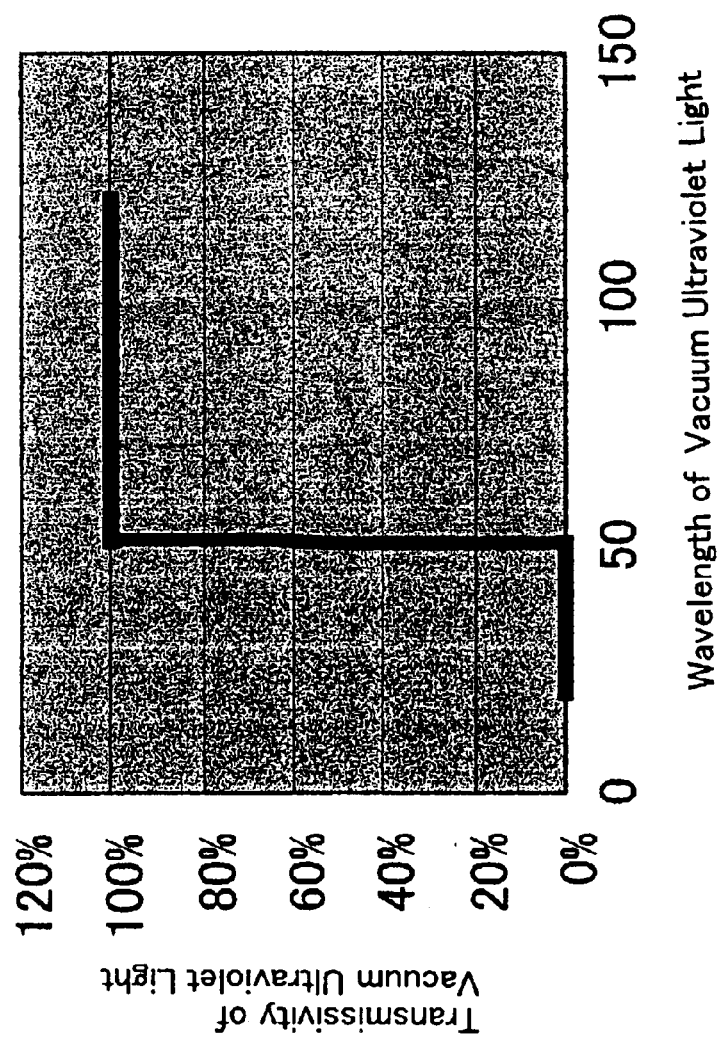
FIG. 12 is a graph for illustrating the transmission characteristic of a vacuum ultraviolet light in a 1 atm helium gas.

FIG. 12 illustrates the transmission characteristic of the vacuum ultraviolet light in a 1 atm helium gas. As can be seen from FIG. 12, the transmissivity of the vacuum ultraviolet light whose wavelength falls in a range of from 50 to 100 nm is 100% substantially in the helium gas, that is, it is absorbed extremely less by the helium gas. Thus, it can be seen that it is possible to expose the substrate S to the vacuum ultraviolet light in the helium gas atmosphere.

The target material 28 is a disk-shaped member or a rod-shaped member whose cross section is shaped as a circle, and comprises a material which can sputter particles upon being irradiated with a laser beam. It is placed in such a direction that it crosses orthogonally to the first and second paths L1, L2 (i.e., in the direction perpendicular to the page surface of FIG. 11). It is rotated by a not-shown target driving system.

Hereinafter, the operations and advantages, which are effected when the surface reforming treatment of the resinous substrate S is carried out with the substrate surface reforming apparatus 21, will be described.

When the laser beam is generated from the YAG laser device 22, the incident laser beam is reflected by half of the beam intensity at the half mirror 23a, and is led to the first path L1 in the case 25 of the abrasion gun 24 through the incident opening 25a. The laser beam following the first path L1 is focused by the first condenser 26a, and is reflected at the first reflector mirror 26b. Thus, the laser beam following the first path L1 is emitted onto the surface of the target material 28, surface which faces the emission opening 25b. On the other hand, the other half of the incident laser beam, which transmits through the half mirror 23a, is reflected at the reflector mirror 23b, and is led to the second path L2 in the case 25 of the abrasion gun 24 through the incident opening 25a. The laser beam following the second path L2 is focused by the second condenser 26c, and is reflected at the second reflector mirror 26d. Thus, the laser beam following the second path L2 is emitted onto the surface of the target material 28, surface which faces the emission opening 25b. Therefore, the laser beams, introduced by way of the first and second paths L1, L2, are emitted to the surface of the target material 28 with different angles, and are superimposed thereon. Accordingly, the surface of the target material 28, which faces the emission opening 25b, is irradiated by the laser beam with the desired beam intensity without deflection.

Moreover, simultaneously with the emission of the laser beam, the gas nozzle 27 sprays the helium gas toward the emission opening 25b from the rear side of the target material 28. Thus, the space between the target material 28 and the resinous substrate S, which is placed to face the emission opening 25b, is kept to the helium gas atmosphere which absorbs the vacuum ultraviolet light extremely less.

When the target material 28 is irradiated with the laser beam in the helium gas atmosphere, a high-temperature plasma is formed on the surface of the target material 28. The temperature of the plasma is controlled so that the vacuum ultraviolet light whose wavelength falls in a range of from 50 to 100 nm is generated. In this instance, when the helium gas is supplied as the shielding gas, the vacuum ultraviolet light is inhibited from being absorbed by air. Moreover, the vacuum ultraviolet light having the wavelength is absorbed by resinous materials with a high absorptivity. Accordingly, when the surface of the resinous substrate S is exposed to the vacuum ultraviolet light, the molecular bonds in the resinous surface are destroyed by the vacuum ultraviolet light so that the resinous surface is activated.

On the other hand, on the surface of the target material 28 which is heated within the plasma or by the plasma, neutral atoms, ions and clusters are formed. They sputter from within the plasma or from the surface of the target material 28 at velocities as high as the sonic-velocity level.

Accordingly, the surface of the resinous substrate S, which is placed to face the emission opening 25b, is activated by the exposure to the vacuum ultraviolet light, and immediately thereafter the sputtering particles adhere on the surface of the resinous substrate S. Consequently, the sputtering particles firmly adhere on the surface of the resinous substrate S. As a result, the electrons are inhibited from being supplied to the surface or being excited inversely so that the activated resinous surface is sustained for a long period of time. Note that the phenomena in the above process take place successively in the same manner as described in the First Preferred Embodiment.

Moreover, since the helium gas, which absorbs the vacuum ultraviolet light less, is used as the shielding gas so that the resinous substrate S is exposed to the vacuum ultraviolet light in the helium gas atmosphere, it is not necessary to place the resinous substrate S, an object to be processed, in a vacuum container. Therefore, not limited to the processes in which the resinous substrate is batch processed by a unit of predetermined pieces, the Third Preferred Embodiment can carry out surface reforming treatments continuously, and can subject a large-sized component parts to surface reforming treatments.

In addition, the vacuum ultraviolet light is generated from the plasma formed on the target material 28 more in the perpendicular direction, and the sputtering particles are emitted from the surface of the target material 28 more in the perpendicular direction. Accordingly, it is possible to substantially simultaneously carry out exposing the resinous substrate S to the vacuum ultraviolet light and adhering the sputtering particles onto the resinous substrate S in one and only direction.

Note that the present invention is not limited to the above-described preferred embodiments. It is possible to give a variety of modifications to the preferred embodiments as far as they fall within the spirit or scope of the present invention.

For example, the optical system for focusing the laser beam on the target material 28 is not limited to the above-described arrangement made by the first and second optical members 23, 26. It can be achieved by a diversity of embodiments.

Moreover, in the Third Preferred Embodiment, the helium gas is used in order to inhibit the vacuum ultraviolet light from being absorbed by air. It is possible to use a hydrogen gas, a neon gas or an argon gas as the shielding gas. In short, it is possible to use gases which absorb the vacuum ultraviolet light less as the shielding gas.

Fourth Preferred Embodiment

Hereinafter, a substrate surface reforming apparatus 31 in a Fourth Preferred Embodiment according to the present invention will be described with reference to FIG. 13.

Figure 13:
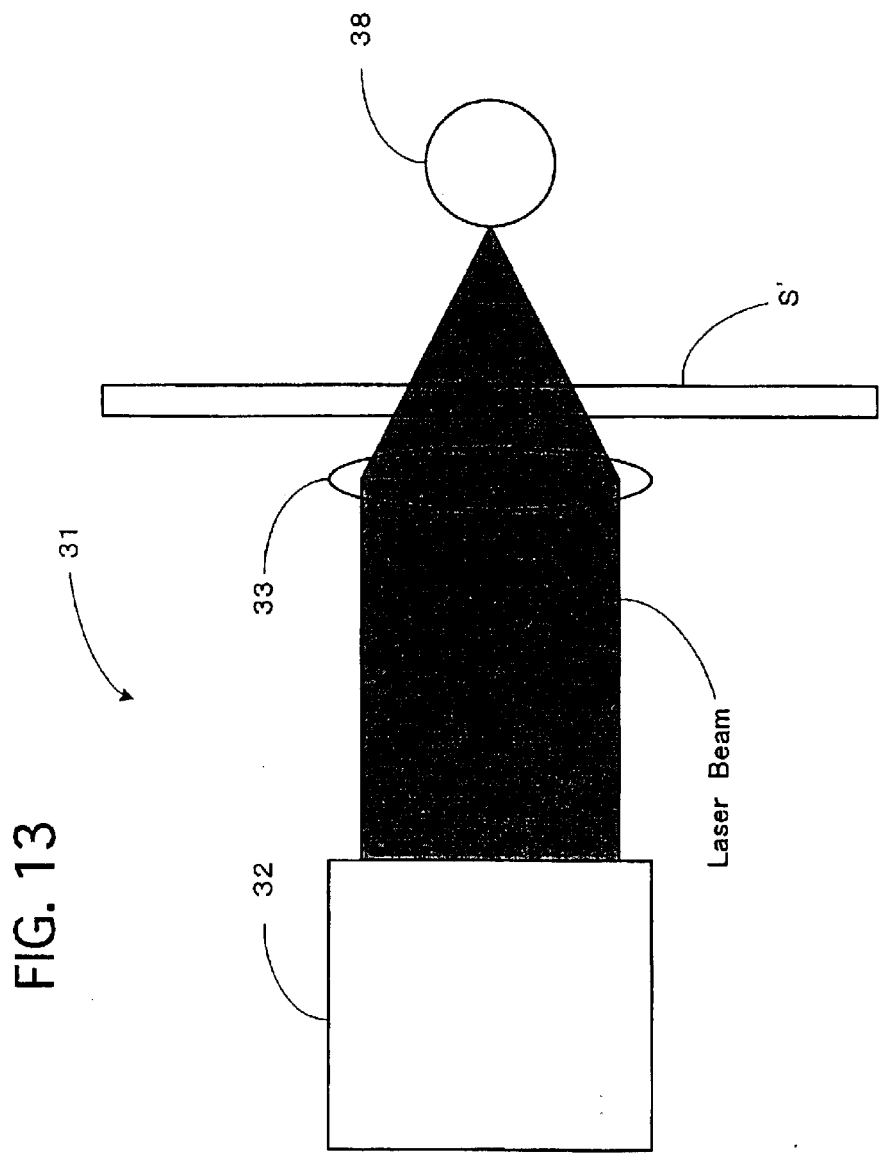
FIG. 13 is a schematic construction diagram for illustrating an overall construction of a substrate surface reforming apparatus in a Fourth Preferred Embodiment according to the present invention.

FIG. 13 is a schematic construction diagram for illustrating an overall construction of the substrate surface reforming apparatus 31. The substrate surface reforming apparatus 31 comprises a pulse YAG laser device 32, a condenser 33, and a target material 38. Moreover, in the surface reforming apparatus 31, the constituent elements, the pulse YAG laser device 32, the condenser 33, a transparent resinous film S' and the target material 38 are placed in this order linearly. Note that the pulse YAG laser device 32 makes the laser beam-generating device according to the present invention, and the pulse YAG laser device 32 and target material 38 make the exposing means and generating means, respectively.

As the transparent resinous film S', being an object to be subjected to a surface reforming treatment, it is possible to use transparent substrates which comprise transparent polyethylene films, for example. However, objects to be surface-reformed are not limited to transparent polyethylene films. As far as transparent substrates comprise carbon-containing materials having carbon-carbon bonds, further preferably organic materials, furthermore preferably resinous materials, and can transmit laser beams, they can be objects to be surface-reformed. Note that the transparent resinous film S' makes the transparent substrate according to the present invention.

The pulse YAG laser device 32 is a known pulse laser beam-generating device, and generates a laser beam whose pulse width falls in a range of from 100 picoseconds to 100 nanoseconds. The pulse YAG laser device 32 is disposed on an opposite side with respect to the target material 28 with the transparent resinous film S' interposed therebetween. The pulse YAG laser device 32 is placed so as to emit the laser beam toward the target material 38 through the condenser 33 and transparent resinous film S'.

The condenser 33 is a convex lens for focusing the pulse laser beam which is emitted from the pulse YAG laser device 32 on the target material 38 with a proper size. In the condenser 33, the size or refractive index of the lens is designed so that the pulse laser beam is focused with a predetermined irradiation intensity on the target material 38. Moreover, the irradiation intensity can preferably be controlled so that a plasma generated from the target material 38 generates a vacuum ultraviolet light having a wavelength which is absorbed by the transparent resinous film S' with a high absorptivity. Specifically, the irradiation intensity of the laser beam can preferably fall in a range of from $10^6$ to $10^{12}$ W/cm$^2$.

The target material 38 comprises a material which sputters particles from the surface upon being irradiated with the pulse laser beam. It is disposed on an opposite side with respect to the pulse YAG laser device 32 with the transparent resinous film S' interposed therebetween. The pulse laser beam generated from the pulse YAG laser device 32 transmits through the transparent resinous film S' while being focused by the condenser 33. Accordingly, the target material 38 is irradiated with the pulse laser beam.

Hereinafter, the operations and advantages, which are effected when the surface reforming treatment of the transparent resinous substrate S' is carried out with the substrate surface reforming apparatus 31, will be described.

When the pulse laser beam whose pulse width falls in a range of from 100 picoseconds to 100 nanoseconds is generated from the pulse YAG laser device 32, the pulse laser beam transmits through the transparent resinous film S' while being focused by the condenser 33. Accordingly, the target material 38 is irradiated with the pulse laser beam. In this instance, since the transparent resinous film S' is transparent, it is not damaged or denatured at all when the pulse laser beam transmits therethrough.

When the target material 38 is irradiated with the pulse laser beam, a high-temperature plasma is formed on the surface of the target material 38. The temperature of the plasma is controlled so that the vacuum ultraviolet light whose wavelength falls in a range of from 50 to 100 nm is generated. Moreover, the vacuum ultraviolet light having the wavelength is absorbed by resinous materials with a high absorptivity. Accordingly, when the surface of the transparent resinous film S' is exposed to the vacuum ultraviolet light, the molecular bonds in the resinous surface are destroyed by the vacuum ultraviolet light so that the resinous surface is activated.

On the other hand, on the surface of the target material 38 which is heated within the plasma or by the plasma, neutral atoms, ions and clusters are formed. They sputter from within the plasma or from the surface of the target material 38 at velocities as high as the sonic-velocity level.

Accordingly, the surface of the transparent resinous film S', which is placed to face the target material 38, is activated by the exposure to the vacuum ultraviolet light, and immediately thereafter the sputtering particles adhere on the surface of the transparent resinous film S'. Consequently, the sputtering particles firmly adhere on the surface of the transparent resinous films'. As a result, the electrons are inhibited from being supplied to the surface or being excited inversely so that the activated resinous surface is sustained for a long period of time. Note that the phenomena in the above process take place successively in the same manner as described in the First Preferred Embodiment.

Moreover, when the target material 38 is irradiated with the pulse laser beam through the transparent resinous film S', it is possible to use lenses whose focal length is short, for example, whose focal length is about 40 mm, for focusing the pulse laser beam on the target material 38, and accordingly to emit the laser beam with a large F value. Consequently, not limited to vacuumed state, it is possible to surface-reform the transparent resinous film S' even under reduced pressures, or in atmospheres close to air, or preferably in shielding gas atmospheres.

In addition, since the pulse laser beam whose pulse width falls in a range of from 100 picoseconds to 100 nanoseconds is used, the transparent resinous film S' is not damaged or denatured at all when the pulse laser beam transmits therethrough.

Note that the present invention is not limited to the above-described preferred embodiments. It is possible to give a variety of modifications to the preferred embodiments as far as they fall within the spirit or scope of the present invention.

For example, the above-described preferred embodiments use the YAG laser devices to generate the laser beam. However, it does not matter at all when they use the other types of laser beam-generating devices.

Moreover, the target materials can be formed as a variety of shapes such as rod shapes, tape shapes and disk shapes.

Fifth Preferred Embodiment

Hereinafter, a substrate surface reforming apparatus 41 in a Fifth Preferred Embodiment according to the present invention will be described with reference to FIG. 15.

Figure 15:
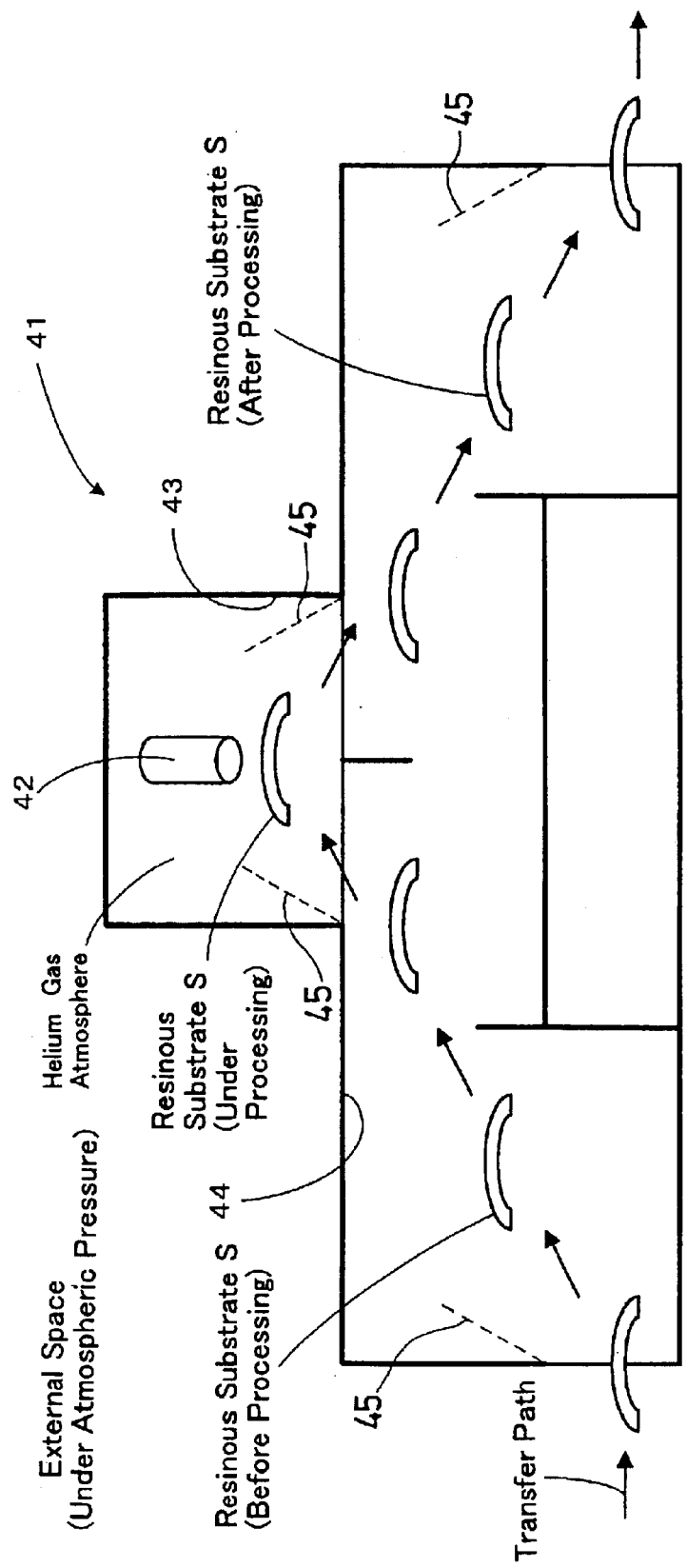
FIG. 15 is a schematic construction diagram for illustrating an overall construction of a substrate surface reforming apparatus in a Fifth Preferred Embodiment according to the present invention.

FIG. 15 is a schematic construction diagram for illustrating an overall construction of the substrate surface reforming apparatus 41. The substrate surface reforming apparatus 41 comprises an abrasion device 42, a processing chamber 43, and a preparatory chamber 44. In the processing chamber 43, the abrasion device 42 is placed, and a resinous substrate S is subjected to a surface reforming treatment. The preparatory chamber 44 is disposed so as to communicate with the processing chamber 43.

Since the resinous substrate S is the same as the resinous substrate in the above-described First Preferred Embodiment, it will not be described herein in detail. Moreover, note that, as described in the First Preferred Embodiment, the objects to be processed are not limited to resinous substrates, and that they can be substrates which comprise carbon-containing materials.

In the processing chamber 43, a space is formed in which a shielding gas atmosphere is kept, and the abrasion device 42 and the resinous substrate S, an objected to be processed, are placed. To make the shielding gas atmosphere, gases are used which absorb the vacuum ultraviolet light less. For example, it is possible to use at least one member selected from the group consisting of a hydrogen gas, a helium gas, a neon gas and an argon gas. Additionally, it is possible to use mixture gases comprising arbitrary combinations of these gases.

The preparatory chamber 44 is a space which is formed between the external space and the processing chamber 43 so as to communicate with the processing chamber 43. The resinous substrate S to be processed is brought in into the processing chamber from the external space through the preparatory chamber 44. After the abrasion device 42 carries out a surface reforming treatment onto the resinous substrate S in the processing chamber 43, the resinous substrate S is taken out from the processing chamber 43 to the external space through the preparatory chamber 44.

When the shielding gas atmosphere in the processing chamber 43 is made by using gases, whose specific gravity is smaller than that of air, such as a hydrogen gas and a helium gas, it is preferable to dispose the processing chamber 43 at an upper position with respect to the preparatory chamber 44 as illustrated in FIG. 15. Specifically, in the surface reforming apparatus 41, the hydrogen gas whose specific gravity is smaller than that of air localizes in the processing chamber 43 which is disposed at a relatively higher position. On the contrary, the air whose specific resistance is larger than that of the hydrogen gas localizes in the preparatory chamber 44 which is disposed at a relatively lower position. Moreover, since the preparatory chamber 44 is disposed between the processing chamber 43 and the external space, the air is inhibited from coming into the atmosphere in the processing chamber 43 from the external space. Therefore, the shielding gas atmosphere, such as the hydrogen gas atmosphere, is kept in the processing chamber 43.

On the other hand, when the shielding gas atmosphere in the processing chamber 43 is made by using gases, whose specific gravity is larger than that of air, such as an argon gas, it is preferable to dispose the processing chamber 43 at a lower position with respect to the preparatory chamber 44, though such a processing chamber 43 is not shown. Specifically, in the surface reforming apparatus 41, the argon gas whose specific gravity is larger than that of air localizes in the processing chamber 43 which is disposed at a relatively lower position. On the contrary, the air whose specific resistance is smaller than that of the argon gas localizes in the preparatory chamber 44 which is disposed at a relatively higher position. Moreover, since the preparatory chamber 44 is disposed between the processing chamber 43 and the external space, the air is inhibited from coming into the atmosphere in the processing chamber 43 from the external space. Therefore, the shielding gas atmosphere, such as the argon gas atmosphere, is kept in the processing chamber 43.

Figure 16:
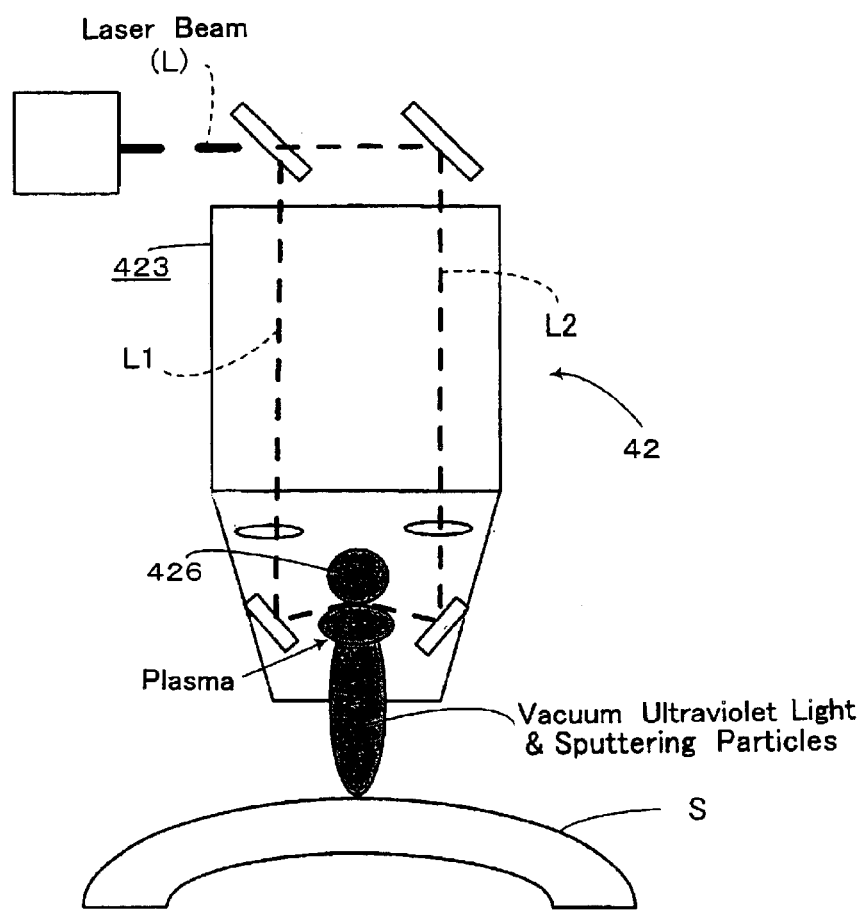
FIG. 16 is a schematic construction diagram for illustrating a construction of a laser abrasion device in the Fifth Preferred Embodiment.

Accordingly, as the abrasion device 42, it is possible to use a device, which is free from a gas nozzle for spraying a shielding gas such as a helium gas, for example, a device as illustrated in FIG. 16.

Hereinafter, the operations and advantages, which are effected when the surface reforming treatment of the resinous substrate S is carried out with the substrate surface reforming apparatus 41, will be described. Note the following descriptions are made on the assumption that the processing chamber 43 is put into a helium gas atmosphere.

First of all, the resinous substrate S, an object to be processed, is brought in into the preparatory chamber 44 from the external space under an atmospheric pressure, and is transferred toward the processing chamber 43. As the resinous substrate S is transferred in the preparatory chamber 44, the atmosphere around the resinous substrate S gradually approaches the helium gas atmosphere from the atmospheric pressure. When the resinous substrate S is brought in into the processing chamber 43 in which the helium gas atmosphere is kept, it is subjected to a laser abrasion treatment, or a surface reforming treatment described below, with the abrasion device 42.

Thereafter, the resinous substrate S whose surface is reformed by the laser abrasion treatment is taken out from the processing chamber 43, in which the helium gas atmosphere is kept, to the external space under the atmospheric pressure through the preparatory chamber 44.

Since the resinous substrate S is exposed to the vacuum ultraviolet light in the helium gas atmosphere which absorbs the vacuum ultraviolet light less, it is not necessary to place the resinous substrate S, an object to be processed, in a vacuum container. Therefore, not limited to the processes in which the resinous substrate is batch processed by a unit of predetermined pieces, the Fifth Preferred Embodiment can carry out surface reforming treatments continuously, and can subject a large-sized component parts to surface reforming treatments.

Moreover, a plurality of the resinous substrates S can be successively brought in into the processing chamber 43 from the external space through the preparatory chamber 44, and can be subjected to the surface reforming treatment. After carrying out the surface reforming treatment, the resinous substrates S can be successively taken out from the processing chamber 43 to the external space through the preparatory chamber 44. Hence, in accordance with the Fifth Preferred Embodiment, it is possible to achieve a production system which can subject a large volume of resinous substrates S to surface reforming treatments continuously and efficiently.

Note that the present invention is not limited to the above-described preferred embodiments. It is possible to give a variety of modifications to the preferred embodiments as far as they fall within the spirit or scope of the present invention.

For example, the optical system for focusing the laser beam on the target material is not limited to the above-described arrangement made by the first and second optical members. It can be achieved by a diversity of embodiments.

Moreover, in the Fifth Preferred Embodiment, the processing chamber 43 always communicates with the preparatory chamber 44. However, it is possible to add the following arrangement. For instance, as indicated with the broken line in FIG. 15, openable-and-closable partition walls 45 can be disposed between the processing chamber 43 and the preparatory chamber 44 and/or between the external space and the preparatory chamber 44. The partition walls 45 can be opened or closed to communicate the processing chamber 43 with or separate it from the preparatory chamber 44 and/or to communicate the external space with or separate it from the preparatory chamber 44. Specifically, the partition walls 45 can be opened to communicate the external surface with the preparatory chamber 44 and to communicate the preparatory chamber 44 with the processing chamber 43 in the following cases alone: i.e., when the resinous substrate S, an object to be processed, is brought in into the preparatory chamber 44 from the external space; when it is brought in into the processing chamber 43 from the preparatory chamber; when it is taken out from the processing chamber 43 to the preparatory chamber 44; and when it is taken out from the preparatory chamber 44 to the external space. Thus, when the resinous substrate S is not transferred, the partition wall is closed to separate the external space from the preparatory chamber 44 and separate the preparatory chamber 44 from the processing chamber 43. With such an arrangement, even when gases, for example, an argon gas which is likely to mix with air because its specific gravity is close to air, is used to make the shielding gas atmosphere, the air is inhibited from coming into the atmosphere in the processing chamber 43 from the external space. Therefore, it is possible to securely keep the shielding gas atmosphere in the processing chamber 43.

In addition, when it is required to carry out the laser abrasion treatment under reduced pressures, it is possible to depressurize by carry out differential evacuation in the processing chamber 43 or around the leading end of an abrasion gun 423 shown in FIG. 16.

Note that an abrasion device can be placed in the processing chamber 43, abrasion device which has the identical arrangements with those of the surface reforming apparatus 21 in the Second Preferred Embodiment as illustrated in FIG. 11, and that the abrasion treatment can be carried out while supplying a shielding gas between the resinous substrate S and a target material 426 shown in FIG. 16.

EXPERIMENTAL EXAMPLES

Experiments were conducted in accordance with the above-described preferred embodiments. Hereinafter, the respective experimental examples will be described with reference to the drawings.

Example No. 1

To begin with, a first experiment (i.e., Example No. 1) was conducted according to the First Preferred Embodiment. Example No. 1 will be hereinafter described.

Figure 3:
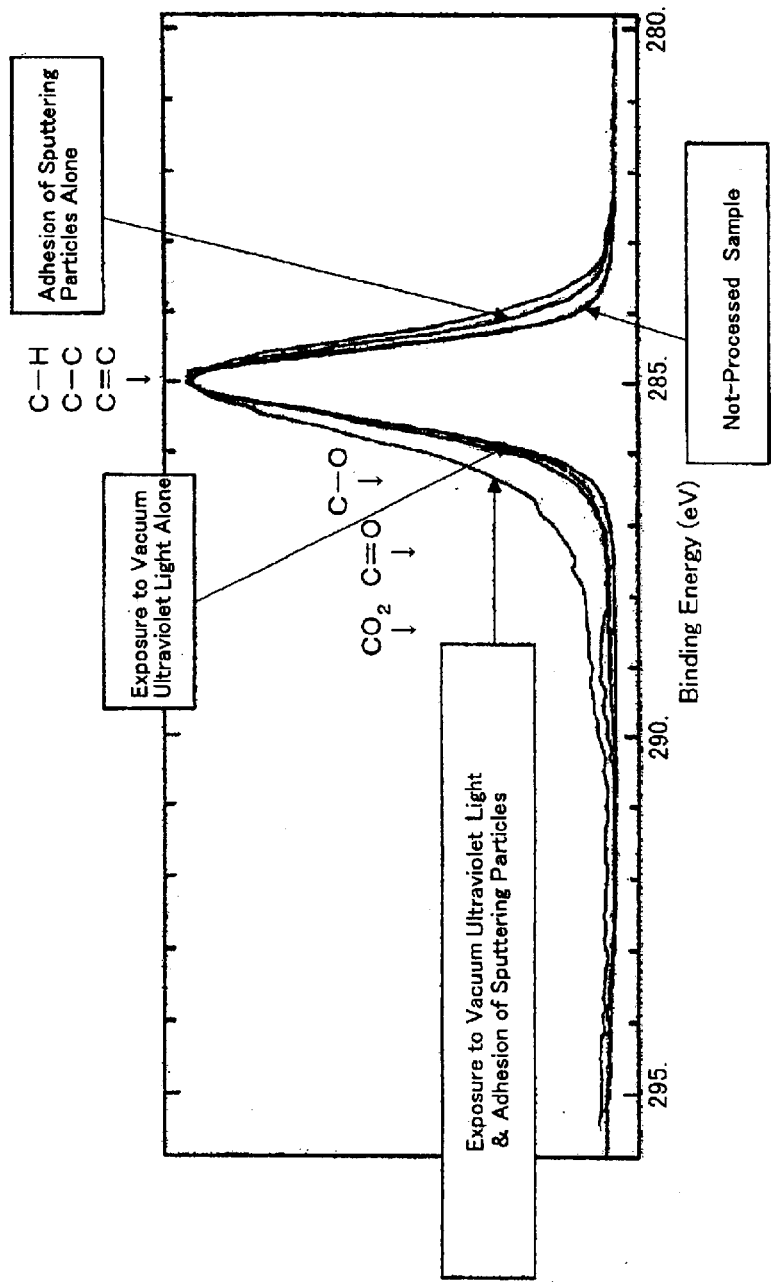
FIG. 3 is a graph for illustrating the results of a photo-electron spectroscopic analysis which was carried out onto samples of Example No. 1, in which a polyethylene film was subjected to the exposure to a vacuum ultraviolet light exposure and the deposition of sputtering particles, and samples of comparative examples.

A polyethylene film was used as a sample of the resinous substrate S. In the vacuumed container 4, the polyethylene film was exposed to the vacuum ultraviolet light by the vacuum ultraviolet light-generating device 2, and sputtering particles resulting from alumina were adhered on the polyethylene film. The resulting samples were analyzed by a photoelectron spectroscopic analysis. As comparative examples, the following samples were prepared: a sample which was exposed to the vacuum ultraviolet light alone; a sample on which only the sputtering particles resulting from alumina adhered; and a sample, a polyethylene film itself which was not processed at all. The respective comparative examples were analyzed likewise by a photoelectron spectroscopic analysis. FIG. 3 illustrates the results of the photoelectron spectroscopic analysis, and shows spectra of the 1s electrons in carbon. The horizontal axis designates the bond energy (eV), and the vertical axis designates the intensity. As can be seen from FIG. 3, in the sample subjected to the exposure to the vacuum ultraviolet light and the adhesion to the sputtering particles, the spectra, resulting from the bonds with oxygen such as C—O, C=O and $CO_2$, were shifted with respect to the spectra of the not-processed comparative sample. On the other hand, in the comparative sample subjected to the exposure to the vacuum ultraviolet light alone and the comparative sample subjected to the adhesion of the sputtering particles only, the observed spectra were substantially the same as those of the non-processed comparative sample. Thus, it is understood that the activated surface (or activated end groups) can be formed and sustained only when both the exposure to the vacuum ultraviolet light and the adhesion of the sputtering particles are carried out.

Subsequently, the above-describe sample and comparative examples were painted, and were assessed for the adhesiveness of the resulting paint films. As a result, high adhesive performance was exhibited only in the sample which was subjected to the exposure to the vacuum ultraviolet light as well as the adhesion of the sputtering particles.

Example No. 2

Further, a second experiment (i.e., Example No. 2) was conducted in accordance with the Second Preferred Embodiment. Example No. 2 will be hereinafter described.

Figure 5:
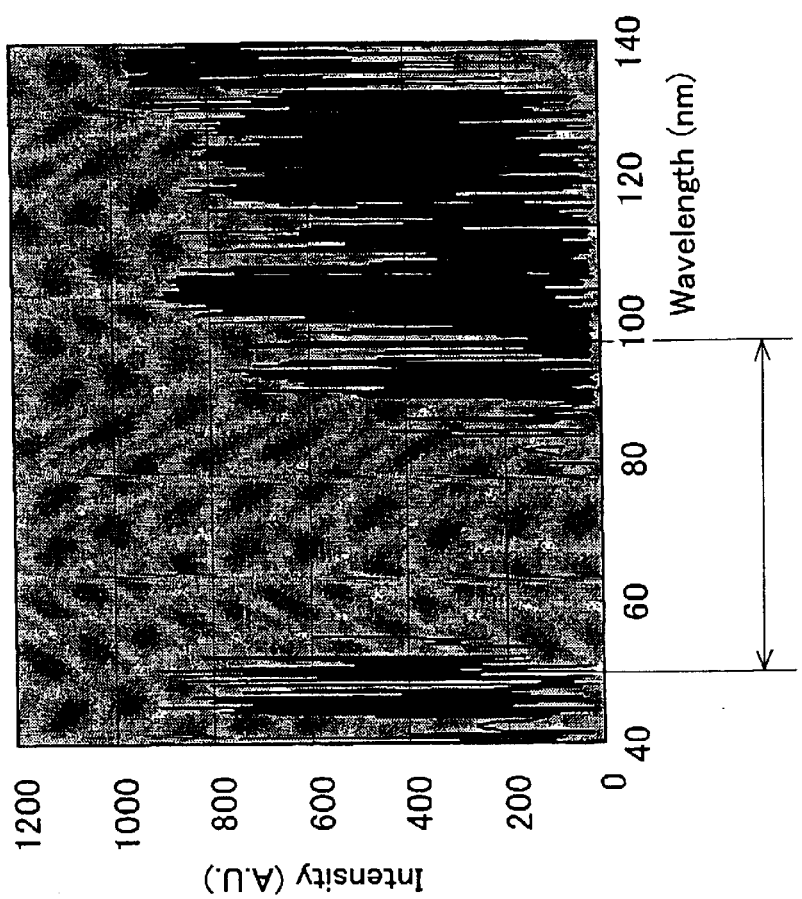
FIG. 5 is a graph for illustrating the intensity distribution of the spectrum of a vacuum ultraviolet light which was generated from a copper target.

In Example No. 2, the following YAG laser device 12 was used in the surface reforming apparatus 11 whose arrangements are illustrated in FIG. 4. The used YAG laser device 12 generated a laser beam which was a higher harmonic wave having a frequency twice as large as the fundamental frequency, whose energy per pulse was 1 J, and whose pulse width was 7 nanoseconds. As the target material 15a, a copper target was used which was composed of copper. The laser beam generated from the YAG laser device 12 was led into the vacuum container 14 by the condenser 13, and was focused on the copper target with a diameter of 800 micrometers approximately. Thus, the copper target was irradiated by the laser beam with an irradiation intensity of $10^8$ W/cm$^2$. When the copper target was irradiated with the laser beam, a high-temperature plasma was generated on the copper target. As a result, the copper plasma generated a vacuum ultraviolet light whose spectrum had a wavelength-intensity distribution as illustrated in FIG. 5. Note that FIG. 5 was illustrated based on the values measured by a cue plate. As can be seen from FIG. 5, it is understood that a continuous spectrum with a high brightness was observed in the wavelength falling in a range of from 50 to 100 nm which is absorbed by resins with a high absorptivity, and in the wavelengths around the specific wavelength.

Figure 6:
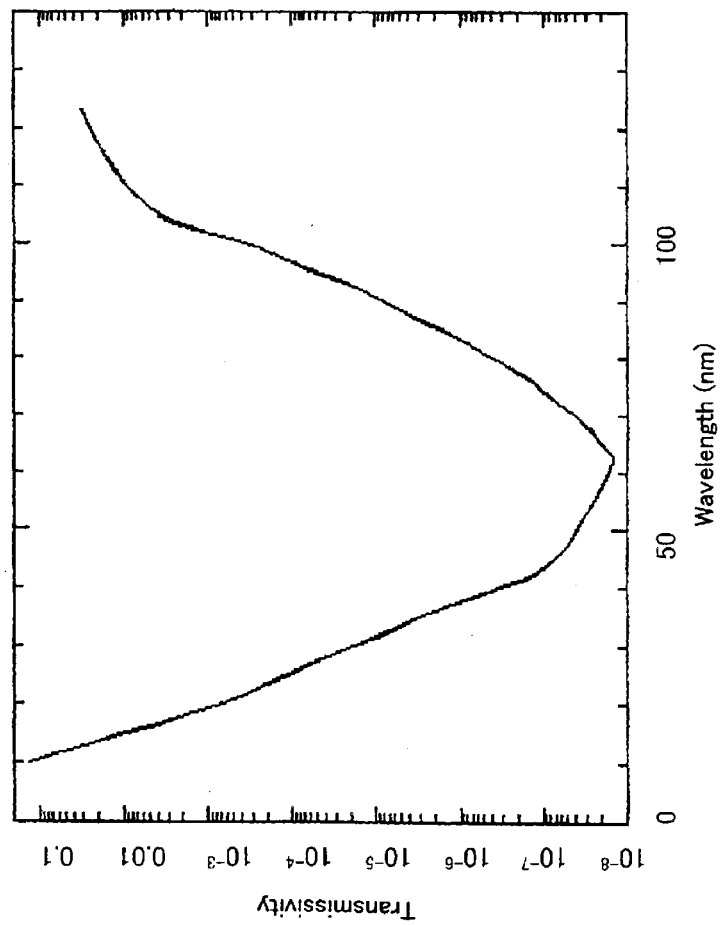
FIG. 6 is a graph for illustrating the transmission characteristic of a polytetrafluoroethylene resin with respect to a vacuum ultraviolet light.

Further, the transmission characteristic of polytetrafluoroethylene, one of resins, with respect to the vacuum ultraviolet light will be described with reference to the graph illustrated in FIG. 6. A polytetrafluoroethylene film was examined for the transmission characteristic. The polytetrafluoroethylene comprised polyterafluoroethylene in an amount of 2.2% by weight, and was 0.2 micrometers thick. From the graph illustrated in FIG. 6, it is understood the polytetrafluoroethylene film exhibited the minimum transmissivity of $10^{-8}$ with respect to the vacuum ultraviolet light whose wavelength was around 60 nm, and exhibited the sharply reduced trasmissivities (i.e., increased absorptivities) with respect to the vacuum ultraviolet lights whose wavelengths fell around 60 nm. The phenomena depend on the absorption characteristic of carbon, one of the components of tetrafluoroethylene. From FIG. 6, it is seen that the vacuum ultraviolet light whose wavelength falls in a range of from 50 to 100 nm is absorbed by tetrafluoroethylene with a high absorptivity.

Figure 7:
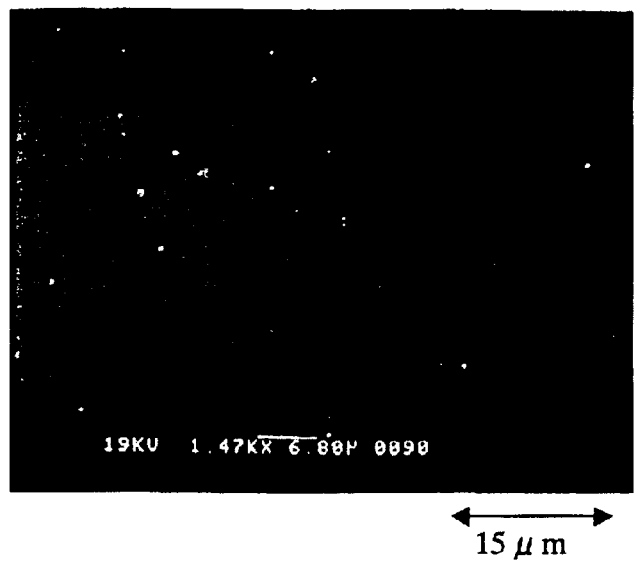
FIG. 7 concerns Example No. 2, and is a traced image for showing the result of an observation on a silicon wafer with a mirror grounded surface, on which particles sputtered from a copper target were collected, with a scanning electron microscope.

Furthermore, the sputtering particles, which were generated from the copper target of the surface reforming apparatus in the Second Preferred Embodiment, were collected with a silicon wafer. They were observed with a scanning electron microscope, and the image was traced as illustrated in FIG. 7. As illustrated in FIG. 7, copper fine particles (dots illustrated in white), whose particle diameters were a few micrometers or less, adhered on the silicon wafer.

Figure 8A:
Figure 8B:

Moreover, a silicone rubber substrate was subjected to the surface reforming treatment in accordance with the Second Preferred Embodiment. After the surface reforming treatment, an adhesive tape was applied to the film which was formed on a surface of the silicone rubber substrate and was composed of the copper fine particles. Then, the adhesive tape was torn off from the silicone rubber substrate manually, thereby assessing the adhesiveness of the fine copper particles onto the silicone rubber substrate. As a result, the fine copper particles hardly adhered onto the adhesive tape. FIG. 8a is a traced image of the film, which was formed on a surface of the silicone rubber substrate and was composed of the copper fine particles, before the adhesiveness assessment test. FIG. 8b is a traced image of the same film after the adhesiveness assessment test. From FIG. 8a and FIG. 8b, it is appreciated that the film was not come off from the silicone rubber substrate though cracks (portions illustrated in white) grow slightly by the adhesiveness assessment test.

Figure 9:
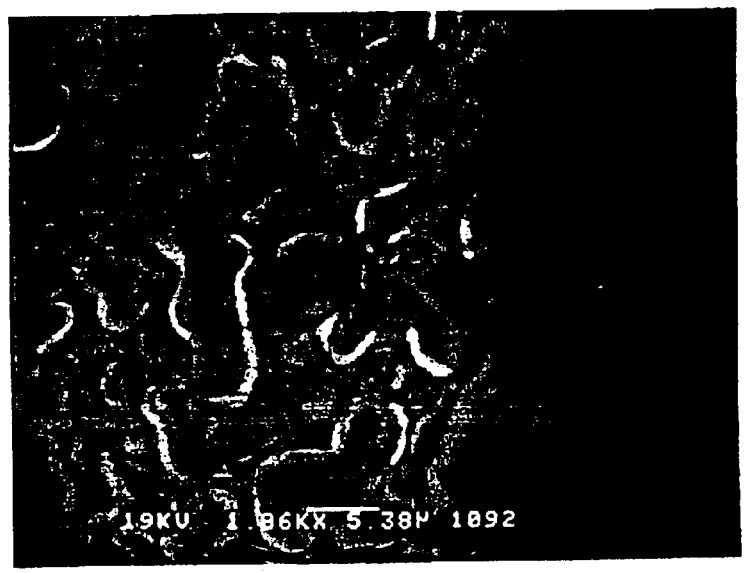
FIG. 9 concerns Example No. 2, and is a traced image for showing the result of an observation on a film, which was formed on a polytetrafluoroethylene resinous substrate and was composed of fine copper particles, with a scanning electron microscope.

In addition, a polytetrafluoroethylene resinous substrate was prepared as the resinous substrate S, and was subjected to the surface reforming treatment in accordance with the Second Preferred Embodiment for 1 minutes. FIG. 9 is a traced image when the polytetrafluoroethylene resinous substrate surface, which was subjected to the exposure to the vacuum ultraviolet light whose wavelength fell around 60 nm and the adhesion of the copper fine particles substantially simultaneously, was observed with a scanning electron microscope. From FIG. 9, it is seen that finely textured fine copper particles adhered on the polytetrafluoroethylene resinous substrate.

Figure 10A:
Figure 10B:
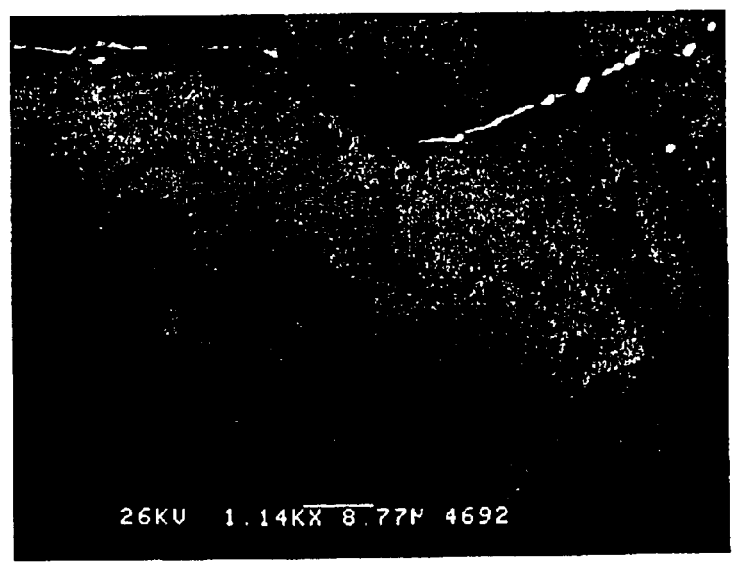

Subsequently, an adhesive tape was applied to the film which was formed on a surface of the polytetrafluoroethylene resinous substrate after the surface reforming treatment, and which was composed of the copper fine particles. Thereafter, the adhesive tape was torn off from the polytetrafluoroethylene resinous substrate manually, thereby assessing the adhesiveness of the fine copper particles onto the polytetrafluoroethylene resinous substrate. As a result, the fine copper particles hardly adhered onto the adhesive tape. FIG. 10a is a traced image of the film, which was formed on a surface of the polytetrafluoroethylene resinous substrate and was composed of the copper fine particles, before the adhesiveness assessment test. FIG. 10b is a traced image of the same film after the adhesiveness assessment test. From FIG. 10a and FIG. 10b, it is appreciated that the film was not come off from the polytetrafluoroethylene resinous substrate, though cracks (portions illustrated in white) grow slightly by the adhesiveness assessment test.

For comparison, a polytetrafluoroethylene resinous substrate to which copper particles were adhered by an electron beam deposition, and a polytetrafluoroethylene resinous substrate to which copper particles were adhered by an electron beam deposition after the exposure to the vacuum ultraviolet light were prepared, and were subjected to the adhesiveness assessment test with the adhesive tape, respectively. As a result, in both of them, most of the copper particles had adhered to the adhesive tape.

Moreover, an epoxy resin, polypropylene, polyethylene, polyethylene terephthalate were used as the material of the substrate, and the resinous substrates were subjected to the surface reforming treatment in accordance with the Second Preferred Embodiment. As a result, all of them produced favorable outcomes in the same manner as Example No. 2 described above. In addition, even when aluminum was used as the target material instead of copper, the processed resinous substrates produced satisfactory results similarly to the cases where the copper target material was used.

Example No. 3

Moreover, a third experiment (i.e., Example No. 3) was conducted in accordance with the Third Preferred Embodiment. Example No. 3 will be hereinafter described.

In Example No. 3, the following YAG laser device 22 was used in the surface reforming apparatus 21 whose arrangements are illustrated in FIG. 11. The used YAG laser device 22 generated a laser beam which was a higher harmonic wave having a frequency twice as large as the fundamental frequency, whose energy per pulse was 1 J, and whose pulse width was 7 nanoseconds. As the target material 28, a copper tape target was used which is composed of a polymer film having a thickness of 30 micrometers and a copper tape having a thickness of 15 micrometers and bonded on the polymer film. The laser beam generated from the YAG laser device 22 was focused by the first and second optical members 23, 26 on the copper tape target 28 with a diameter of 800 micrometers approximately. Thus, the copper tape target 28 was irradiated by the laser beam with an irradiation intensity of $2.5 \times 10^8$ W/cm². When the copper tape target 28 was irradiated with the laser beam, a high-temperature plasma was generated on the copper tape target 28. As a result, the copper plasma generated a vacuum ultraviolet light spectrum. Simultaneously with the generation of the vacuum ultraviolet light, the gas nozzle 27 supplied a helium gas from the rear side of the copper tape target 28 toward the emission opening 25b, and thereby turns the space between the copper tape target 28 and the resinous substrate S into a helium gas atmosphere.

A polyethylene terephathalate (PET) resinous substrate S was placed at a position from 5 mm to 1 cm away from the emission opening 25b disposed at the leading end of the abrasion gun 24. Then, the copper tape target 28 was abraded with the surface reforming apparatus 21 according to the Third Preferred Embodiment for 5 minutes. Note that, although the accessible distances of the sputtering particles depend greatly on the material qualities and sizes in 1 atm helium gas atmosphere, it is possible to design the accessible distances to a few centimeters or more depending on specific conditions.

When the thickness of the film, which was formed on the PET resinous substrate S by the above-described process and which was composed of copper particles, was measured with a step meter, it was found to be about 800 nm. Moreover, a tearing test was carried out by applying an adhesive tape onto the copper particles which were abraded on the PET resinous substrate S and by manually tearing off the adhesive tape therefrom. As a result, the copper particles were hardly torn off from the PET resinous substrate S.

Example No. 4

In addition, a fourth experiment (i.e., Example No. 4) was conducted in accordance with the Third Preferred Embodiment. Example No. 4 will be hereinafter described.

Figure 14:
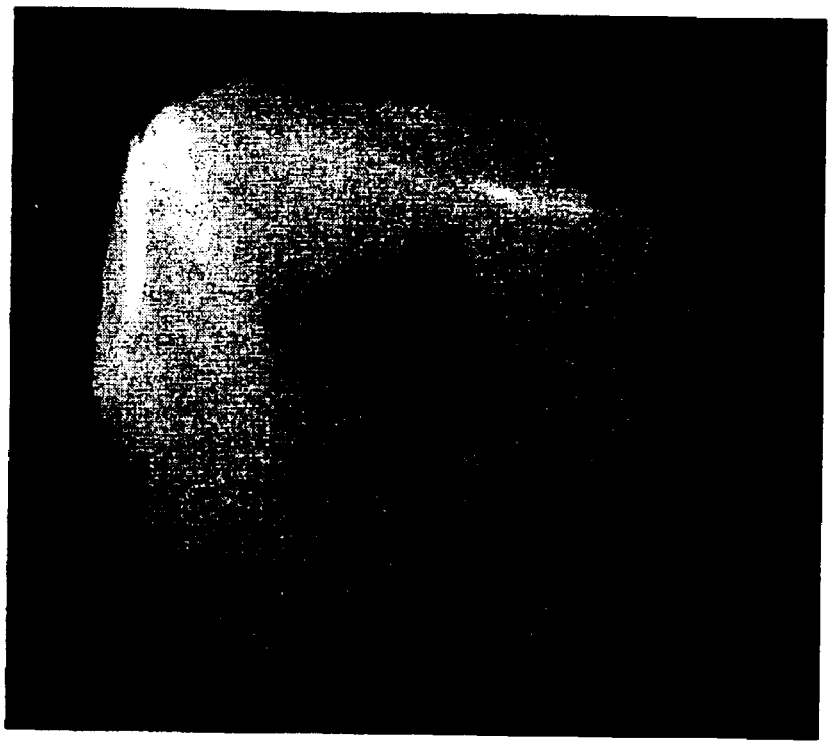
FIG. 14 concerns Example No. 4, and is a traced image in which an alumina film, formed on a polyethylene film, was viewed.

In Example No. 4, the following YAG laser device 32 was used in the surface reforming apparatus 31 whose arrangements are illustrated in FIG. 13. The used YAG laser device 32 generated a laser beam whose energy per pulse was 1 J, and whose pulse width was 7 nanoseconds. As the transparent resinous film S', a polyethylene film was used whose thickness was 50 micrometers. As the target material 38, alumina was used. In a helium gas atmosphere under a reduced pressure to $1/10$ atm, the laser beam generated from the YAG laser device 32 was focused by a near-focal condenser 33 having a focal length of 40 mm on the copper target with a diameter of 2 mm approximately. Thus, the target material 38 was irradiated with the laser beam. When the target material 38 was irradiated with the laser beam, a high-temperature plasma was generated on the target material 38 which was composed of alumina. As a result, the alumina plasma generated a vacuum ultraviolet spectrum. When a laser abrasion operation was carried out with the surface reforming apparatus 31 according to the Fourth Preferred Embodiment for 3 minutes, alumina was deposited uniformly on the transparent resinous substrate S' which was composed of the polyethylene film. In the traced image illustrated in FIG. 14, the portions shown in white are portions where the alumina was deposited. The squared portion shown in gray at the center of the drawing was a portion which was covered with a glass cover for measuring the thickness of the alumina. Note that the size of the squared portion was actually a square whose side was 10 mm each. As a result of the thickness measurement, the thickness was found to be 200 nm approximately. Note that the thickness of some 20 nm is sufficed for using the film in the application to gas-barrier films. Accordingly, when the transparent resinous film S' is fed at a feeding rate of some 15 cm/minute, it is possible to coat a uniform alumina film over wide areas.

Having now fully described the present invention, it will be apparent to one of ordinary skill in the art that many changes and modifications can be made thereto without departing from the spirit or scope of the present invention as set forth herein including the appended claims.

What is claimed is:

1. A process for reforming a surface of a substrate composed of a carbon-containing material, comprising the step of:
   exposing a surface of a substrate to a vacuum ultraviolet light, and depositing sputtering particles on the surface of the substrate.

2. The process set forth in claim 1, wherein the substrate is placed on a side of a laser beam-irradiating surface of a target material, the surface of the substrate is exposed to a vacuum ultraviolet light which is generated by irradiating the target material with a laser beam, and particles, which sputter from the target material, are deposited on the surface of the substrate.

3. The process set forth in claim 2, wherein the substrate is placed on a side of a laser beam-irradiating surface of a target material in a container, and the target material placed in the container is irradiated with a laser beam.

4. The process set forth in claim 2, wherein the target material is irradiated with a laser beam in a shielding gas atmosphere or while supplying a shielding gas between the substrate and the target material at least.

5. The process set forth in claim 4, wherein at least one member, selected from the group consisting of a hydrogen gas, a helium gas, a neon gas and an argon gas, mixture gases composed of arbitrary combination of the gases, or mixture gases in which the gases are major components, is used as the shielding gas.

6. The process set forth in claim 2, wherein the substrate is composed of a transparent substrate in which a laser beam can transmit, and the target material is irradiated with a laser beam through the transparent substrate.

7. The process set forth in claim 2, wherein the laser beam is a pulse laser beam whose pulse duration falls in a range of from 100 picoseconds to 100 nanoseconds.

8. The process set forth in claim 2, wherein the conditions of irradiating the target material with the laser beam are set so as to generate a vacuum ultraviolet light, whose wavelength falls in a range of from 50 to 100 nm, from the target material.

9. The process set forth in claim 2, wherein the irradiation intensity of the laser beam is set so as to fall in a range of from $10^8$ to $10^{12}$ W/cm$^2$.

10. An apparatus for reforming a surface of a substrate composed of a carbon-containing material, comprising:
    means for exposing the surface of the substrate to a vacuum ultraviolet light; and
    means for generating sputtering particles which are to be deposited on the surface of the substrate exposed to the vacuum ultraviolet light.

11. The apparatus set forth in claim 10, wherein the exposure of the substrate to the vacuum ultraviolet light by the exposing means and the generation of the sputtering particles by the generating means are carried out simultaneously.

12. An apparatus for reforming a surface of a substrate composed of a carbon-containing material, comprising:
    a laser beam-generating device for generating a laser beam;
    a target material;
    a substrate placed on a side of a laser beam-irradiating surface of the target material, and composed of a carbon-containing material; and
    an optical member for focusing the laser beam generated by the laser beam-generating device on the target material,
    wherein the surface of the substrate is exposed to a vacuum ultraviolet light, which is generated by irradiating the target material with the laser beam through the optical member, and particles, which sputter from a surface of the target material irradiated with the laser beam, are deposited on the surface of the substrate.

13. The apparatus set forth in claim 12 further comprising a container in which the substrate is placed on the side of the laser beam-irradiating surface of the target material,
    wherein the laser beam generated by the laser beam-generating device is led into the container through the optical member, and is focused on the target material.

14. The apparatus set forth in claim 12 further comprising means for supplying a shielding gas,
    wherein the target material is irradiated with the laser beam through the optical member while supplying the shielding gas between the substrate and the target material at least with the supplying means.

15. The apparatus set forth in claim 14, wherein the shielding gas is at least one member selected from the group consisting of a hydrogen gas, a helium gas, a neon gas, an argon gas and mixture gases composed of arbitrary combination of the gases.

16. The apparatus set forth in claim 12 further comprising a processing chamber in which a shielding gas atmosphere is kept and the substrate is placed on the side of the laser beam-irradiating surface of the target material, wherein the surface of the substrate is exposed to a vacuum ultraviolet light, which is generated by irradiating the target material with the laser beam through the optical member, and particles, which sputter from a surface of the target material irradiated with the laser beam, are deposited on the surface of the substrate within the processing chamber.

17. The apparatus set forth in claim 16 further comprising a preparatory chamber disposed between an external space and the processing chamber to communicate with the processing chamber, wherein the substrate is brought in into the processing chamber from the external space through the preparatory chamber, and is taken out from the processing chamber to the external space through the preparatory chamber.

18. The apparatus set forth in claim 17, wherein a gas whose specific gravity is smaller than that of air is used as the shielding gas, and the processing chamber is disposed at an upper position with respect to the preparatory chamber.

19. The apparatus set forth in claim 17 further comprising an openable-and-closable partition wall disposed between the processing chamber and the preparatory chamber and/or between the external space and the preparatory chamber, wherein the partition wall is opened or closed to communicate the processing chamber with or separate it from the preparatory chamber and/or to communicate the external space with or separate it from the preparatory chamber.

20. The apparatus set forth in claim 12, wherein the substrate is composed of a transparent substrate in which a laser beam can transmit, and the laser beam-generating device irradiates the target material with a laser beam through the transparent substrate.

\* \* \* \* \*